(12) United States Patent
Shimizu et al.

(10) Patent No.: US 8,253,158 B2
(45) Date of Patent: Aug. 28, 2012

(54) ORGANIC ELECTROLUMINESCENCE DISPLAY AND METHOD FOR MANUFACTURING THE SAME

(75) Inventors: Takahisa Shimizu, Saitama (JP); Shohei Kimura, Tokyo (JP); Tatsuya Midorikawa, Tokyo (JP); Shinya Abe, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 13/136,846

(22) Filed: Aug. 12, 2011

(65) Prior Publication Data

US 2012/0025192 A1    Feb. 2, 2012

Related U.S. Application Data

(63) Continuation of application No. PCT/JP2010/051810, filed on Feb. 8, 2010.

(30) Foreign Application Priority Data

Feb. 16, 2009    (JP) .................................. 2009-032503

(51) Int. Cl.
  *H01L 33/00*    (2010.01)
  *H01L 51/40*    (2006.01)
(52) U.S. Cl. ................ 257/98; 257/40; 438/29; 438/99; 313/506
(58) Field of Classification Search .................... 257/89, 257/98; 438/99
See application file for complete search history.

(56) References Cited

U.S. PATENT DOCUMENTS

| | | | |
|---|---|---|---|
| 6,420,200 B1 * | 7/2002 | Yamazaki et al. | 438/30 |
| 7,411,344 B2 * | 8/2008 | Yamazaki et al. | 313/506 |
| 7,414,361 B2 * | 8/2008 | Nozawa | 313/506 |
| 7,541,734 B2 * | 6/2009 | Yamazaki et al. | 313/503 |
| 7,583,020 B2 * | 9/2009 | Yamazaki | 313/504 |
| 7,605,535 B2 * | 10/2009 | Kobayashi | 313/506 |
| 7,723,916 B2 * | 5/2010 | Abe et al. | 313/506 |

(Continued)

FOREIGN PATENT DOCUMENTS

JP    11-067454    3/1999

(Continued)

OTHER PUBLICATIONS

International Preliminary Report on Patentability for International Application No. PCT/JP 2010/051810, mailed Sep. 22, 2011, 7 pgs.

*Primary Examiner* — David Vu
*Assistant Examiner* — Earl Taylor
(74) *Attorney, Agent, or Firm* — Squire Sanders (US) LLP

(57) ABSTRACT

One embodiment of the present invention is an organic electroluminescence display, including: a substrate with a partition wall between adjacent organic electroluminescence elements; a first electrode layer formed on the substrate; a hole transport layer formed on both the first electrode layer and the partition wall; an underlayer formed on the hole transport layer; a first light emitting layer formed on the underlayer, emitted light from the first light emitting layer having a first wavelength; a second light emitting layer formed so as to partially overlap the first light emitting layer, emitted light from the second light emitting layer having a second wavelength, and the second wavelength being longer than the first wavelength; and a second electrode layer, wherein overlapping point of the first light emitting layer and the second light emitting layer is above the partition wall.

9 Claims, 15 Drawing Sheets
(2 of 15 Drawing Sheet(s) Filed in Color)

U.S. PATENT DOCUMENTS

| | | | |
|---|---|---|---|
| 7,786,667 B2* | 8/2010 | Yamakawa et al. | 313/504 |
| 7,825,584 B2* | 11/2010 | Kim | 313/504 |
| 7,839,081 B2* | 11/2010 | Kubota et al. | 313/506 |
| 7,850,501 B2* | 12/2010 | Yamazaki et al. | 445/24 |
| 7,880,380 B2* | 2/2011 | Yamazaki et al. | 313/506 |
| 7,884,541 B2* | 2/2011 | Seki et al. | 313/504 |
| 7,948,160 B2* | 5/2011 | Yuki | 313/498 |
| 7,977,873 B2* | 7/2011 | Asano | 313/506 |
| 7,999,463 B2* | 8/2011 | Nomura | 313/506 |
| 8,040,056 B2* | 10/2011 | Abe et al. | 313/506 |
| 2003/0178935 A1 | 9/2003 | Nishimura et al. | 313/498 |
| 2004/0077113 A1* | 4/2004 | Yamazaki et al. | 438/29 |
| 2004/0202778 A1* | 10/2004 | Nishiguchi et al. | 427/68 |
| 2005/0140288 A1* | 6/2005 | Suzuki | 313/506 |
| 2006/0220537 A1* | 10/2006 | Takeshita et al. | 313/505 |
| 2006/0244369 A1* | 11/2006 | Eiichi | 313/504 |
| 2006/0257686 A1* | 11/2006 | Shimizu et al. | 428/690 |
| 2006/0269657 A1* | 11/2006 | Shimizu et al. | 427/66 |
| 2006/0280859 A1* | 12/2006 | Shimizu et al. | 427/66 |
| 2007/0031587 A1* | 2/2007 | Takeshita et al. | 427/64 |
| 2007/0046185 A1* | 3/2007 | Kim | 313/504 |
| 2007/0066179 A1* | 3/2007 | Nakamura et al. | 445/46 |
| 2007/0071884 A1* | 3/2007 | Takeshita et al. | 427/66 |
| 2007/0164671 A1* | 7/2007 | Yamazaki et al. | 313/506 |
| 2007/0190236 A1* | 8/2007 | Murata | 427/66 |
| 2007/0218797 A1* | 9/2007 | Yamazaki et al. | 445/70 |
| 2007/0281575 A1* | 12/2007 | Takeshita et al. | 445/58 |
| 2008/0032039 A1* | 2/2008 | Murata | 427/66 |
| 2008/0122351 A1* | 5/2008 | Kitazume | 313/504 |
| 2008/0231179 A1* | 9/2008 | Abe et al. | 313/504 |
| 2008/0311426 A1* | 12/2008 | Kitazume | 428/690 |
| 2009/0072724 A1* | 3/2009 | Seki et al. | 313/504 |
| 2009/0128014 A1* | 5/2009 | Kitazume | 313/504 |
| 2009/0160322 A1* | 6/2009 | Yoshida et al. | 313/504 |
| 2009/0206726 A1* | 8/2009 | Yamazaki et al. | 313/498 |
| 2010/0079067 A1* | 4/2010 | Abe et al. | 313/506 |
| 2010/0124796 A1* | 5/2010 | Yamazaki et al. | 438/29 |
| 2011/0121719 A1* | 5/2011 | Yokoyama et al. | 313/504 |

FOREIGN PATENT DOCUMENTS

| | | |
|---|---|---|
| JP | 2007-115465 | 5/2007 |
| JP | 2007227023 A * | 9/2007 |
| JP | 2008-041747 | 2/2008 |
| JP | 2008-192311 | 8/2008 |
| JP | 2009032503 A * | 2/2009 |
| WO | WO 2010092931 A1 * | 8/2010 |

* cited by examiner

An enlarged photograph of a pixel of a panel

Example 1
Printing order: blue (first), green, red (last)

Comparative Example 1
Printing order: red (first), green, blue (last)

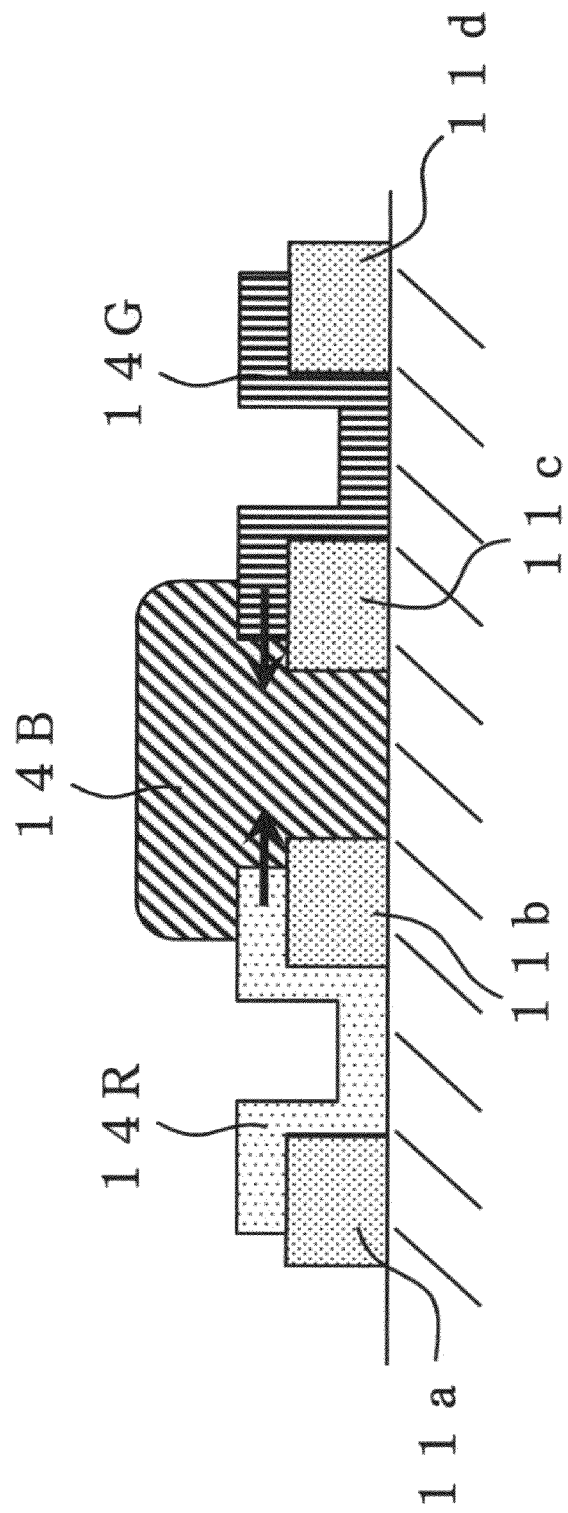

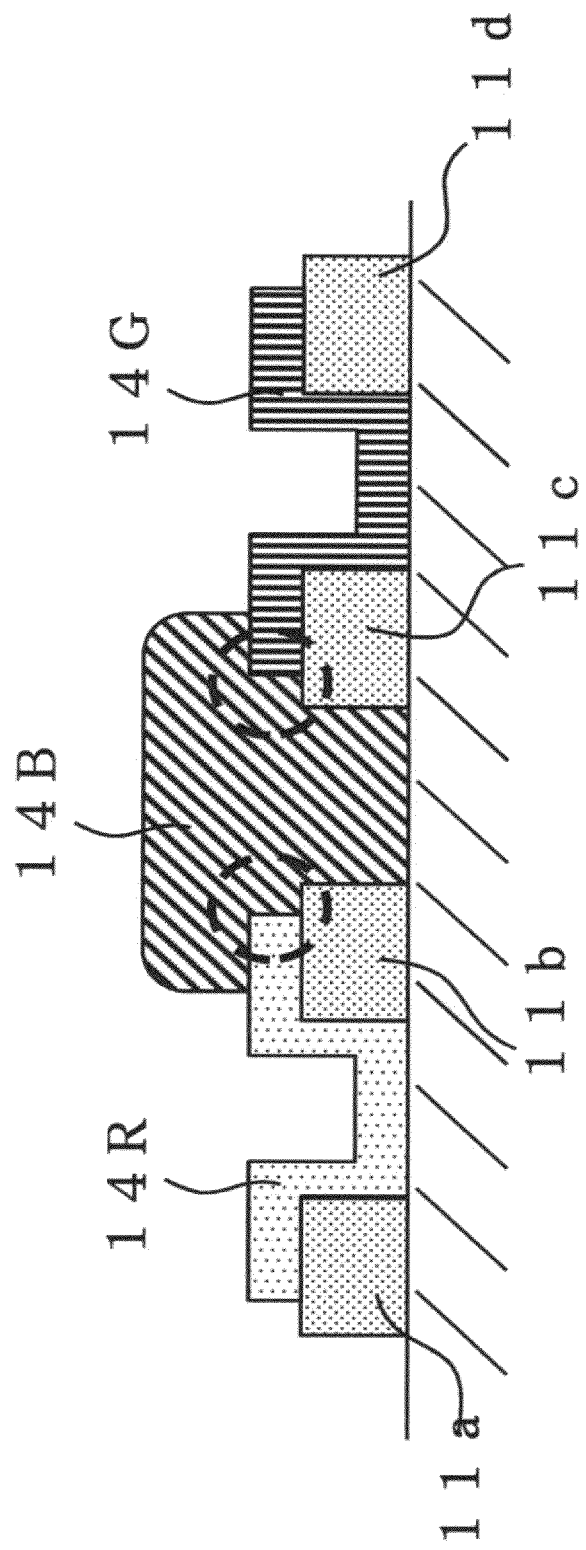

ORGANIC ELECTROLUMINESCENCE DISPLAY AND METHOD FOR MANUFACTURING THE SAME

CROSS REFERENCE TO RELATED APPLICATION

This application is a continuation of International Application No. PCT/JP2010/051810, filed, Feb. 8, 2010, the entire contents of which is incorporated herein by reference.

This application is based upon and claims the benefit of priority from the prior Japanese Patent Application No. 2009-032503, filed on Feb. 16, 2009, the entire content of which is incorporated herein by reference.

BACKGROUND OF THE INVENTION

1. Field of the Invention

The present invention is related to an organic electroluminescence display and a method for manufacturing an electroluminescence display.

2. Description of the Related Art

An organic EL (Electro Luminescence) element emits light when a current is supplied to a light emitting medium layer between two opposed electrodes, and, in order to achieve efficient light emission, it is important to keep a film thickness of the light emitting medium layer to about 100 nm. Further, in the case of forming a display from the organic EL element, it is necessary to perform patterning on the organic EL element with high definition.

A low molecular material and a high molecular material can be used as the organic light emitting material for the light emitting layer formed on a substrate or the like. The low molecular material is subjected to resistive heating vapor deposition and the like to form a thin film, and at the same time the patterning is performed by using a microscopically patterned mask. However, this method has a problem in that patterning accuracy is reduced with an increase in size of a substrate.

Therefore, the high molecular material has recently been used as the organic light emitting material, and a method of forming a thin film by wet coating with a coating liquid obtained by dispersing or dissolving the organic light emitting material into a solvent has been tried. Spin coating, bar coating, projection coating, dip coating, and the like are known as the wet coating method for the thin film formation. However, the wet coating methods have difficulty in realizing high definition patterning and color coding with R, G, and B, and it is considered that the thin film is most effectively formed by a printing process that is capable of achieving excellent color coding and patterning.

A glass substrate is often used as a substrate in an organic electroluminescence element or a display. Thus, a method which uses a metal hard printing plate such as a gravure printing method is unsuitable. Offset printing which uses a rubber blanket having elasticity and a relief printing method which uses a rubber printing plate and photosensitive resin printing plate having elasticity are suitable. A method (Japanese Patent Laid-Open No. 2001-93668 Official Gazette) using offset printing and a method (Japanese Patent Laid-Open No. 2001-155858 Official Gazette) using relief printing are actually proposed as an attempt to achieve these printing methods.

In addition, a cylindrically pressing type relief printing machine comprises a cylinder type blanket cylinder and a flat surface table (not illustrated in the figure) which is fixed and placed at a predetermined position. Specifically, this machine includes the following components: a flat surface table for horizontally fixing a flat relief printing plate at a predetermined position; a flat surface table for horizontally fixing a substrate (a substrate to be printed) at a predetermined position; an ink supplying roller which attaches an ink on a top surface by moving, rotating and touching on a surface of a relief printing plate placed and fixed on a surface table for fixing a relief printing plate; and a blanket cylinder, wherein an ink on the top surface is transferred to a blanket which has a surface is made of rubber, by rotation and movement of the blanket rotating on a surface of a relief printing plate in a stand by mode of an ink supplying roller, and further an ink transferred on a surface of a blanket is transferred to a substrate (a substrate to be printed) by the rotation and movement of a blanket cylinder, thereby printing is performed.

It is known that an ink of a viscous type (in other words, thixotropy type) or a liquid type used for a relief printing method has the most suitable viscosity and surface tension. Especially, a viscosity modifier such as a thickener or a surface activating agent for adjusting a surface tension is generally added to a liquid type ink.

In the case where electronic materials are printed, solubility thereof may be limited or impurity may be not preferably included therein.

Especially, when a film is formed by printing an organic light emitting material using a printing method, an organic light emitting material is dispersed or dissolved in a solvent such as water, alcohol or an organic solvent (including a binder resin if necessary), thereby an ink for printing or coating is made.

It is generally known that in a case where a pattern of a film of an organic light emitting material is formed and the pattern is made to emit light in a element, the higher the purity of a film made of an organic light emitting material is, the better the durability of an element is. Therefore, since the thickener or the like remaining in the organic light emitting material lowers purity, the thickener or the like can not be included in an ink. Therefore, from this reason, the scope adjustable properties of an organic light emitting material ink for obtaining an ink transfer property of a printed matter and achieving stability of a pattern shape is limited.

Due to the above-mentioned reason and low solubility, especially in the case of a light emitting material case, only some kinds of aromatic solvents can be used, thereby reducing the range of usable inks.

A display panel for use in mobile terminals such as a mobile phone, PDA (personal digital assistant) needs a high definition display of 100 ppi or more. In such a high definition display, the distance between pixels is short, for example, 40-10 µm. Therefore, in the case where positional accuracy during printing is poor, a printing pattern may be shifted near to an adjacent pixel and solidify. In addition, even if position accuracy during printing is not poor, in the case where a liquid printing ink is near a printed pattern of an adjacent pixel, a solidified printed pattern may be dissolved again in an approaching printing ink, and color mixture frequently occurs.

Especially, in the case where a material having a long light emitting wavelength (roughly, long (red)>(green)>(blue) short) is mixed in a material having a short light emitting wavelength, a phenomenon of energy transfer causes a material having a long light emitting wavelength to be preferentially emitted in an organic EL element. That is, in the case where blue having a short wavelength is mixed with red having a long wavelength, the color of the light which is emitted shifts significantly from blue, and the color of the light emitted is close to white.

In addition, formation of a light emitting layer by a printing method is significantly influenced by the wettability of a surface of a region to be formed. Therefore, in the case where a layer directly below (hereinafter, an underlayer) of a light emitting layer is conventionally formed only inside a pixel of a partition wall substrate, wettability of an upper surface of a partition wall which is not printed is different from wettability inside a pixel. Therefore, a film thickness of a light emitting layer can not be stably uniform.

Further, because a light emitting layer is formed on an underlayer, a film forming state of the light emitting layer changes depending on the film forming state of the underlayer. That is, if a film thickness of an underlayer is not uniform, concave and convex of a surface or non-uniform wettability of a surface produce a light emitting layer of having a non-uniform film thickness and thereby, uneven light emitting occurs.

The present invention provides an organic electroluminescence display and a method for manufacturing the display, the display having the following merits. Shift of chromaticity minimized as much as possible, a light emitting layer having a uniform film thickness is formed and thereby, a uniform and stable light is emitted and production yield is improved.

[Patent Document 1] JP-A-2001-93668
[Patent Document 2] JP-A-2001-155858
[Patent Document 3] JP-A-2001-155858

SUMMARY OF THE INVENTION

The first aspect of the present invention is an organic electroluminescence display, including:
a substrate with a partition wall and a thin film transistor between adjacent organic electroluminescence elements; a first electrode layer formed on the substrate, the first electrode layer being in contact with the thin film transistor;
a hole transport layer formed on both the first electrode layer and the partition wall;
an underlayer having a stripe shape formed on the hole transport layer;
a first light emitting layer formed on the underlayer, the first light emitting layer configured to emit light having a first wavelength;
a second light emitting layer formed so as to partially overlap the first light emitting layer, the second light emitting layer configured to emit light having a second wavelength, and the second wavelength being longer than the first wavelength; and
a second electrode layer,
wherein
an overlapping point of the first light emitting layer and the second light emitting layer is above the underlayer formed above the partition wall,
and
wherein the first light emitting layer has a stripe shape, the second light emitting layer has a stripe shape, and the first light emitting layer and the second light emitting layer are is perpendicular to the underlayer.

The second aspect of the present invention is the organic electroluminescence display according to the first aspect, wherein the hole transport layer is formed on an entire upper surface of both the first electrode layer and the partition wall.

The third aspect of the present invention is a method for manufacturing an organic electroluminescence display, the method including:

a first step in which a first electrode layer is formed on a substrate having a partition wall and a thin film transistor between adjacent organic electroluminescence elements, the first electrode layer being in contact with the thin film transistor;
a second step in which a hole transport layer is formed on both the first electrode layer and the partition wall;
a third step in which an underlayer having a stripe shape is formed on the hole transport layer on both the first electrode layer and the partition wall;
a fourth step in which a first light emitting layer is formed on the underlayer, the first light emitting layer configured to emit light having a first wavelength;
a fifth step in which a second light emitting layer is formed on the underlayer so as to partially overlap the first light emitting layer, the second light emitting layer configured to emit light having a second wavelength, and the second wavelength being longer than the first wavelength; and
a sixth step in which a second electrode layer is formed on the first or second light emitting layer,
wherein, in the fourth step and the fifth step, the first light emitting layer is formed so as to have a stripe shape, the second light emitting layer is formed so as to have a stripe shape, and the first light emitting layer and the second light emitting layer are perpendicular to the underlayer.

The fourth aspect of the present invention is the method for manufacturing an organic electroluminescence display according to the third aspect, wherein, in the fourth step, the first light emitting layer is formed by forming a pattern using an ink including a first colorant emitting light of the first wavelength, and wherein in the fifth step, after the first light emitting layer is solidified, the second light emitting layer is formed by forming a pattern using an ink including a second colorant emitting light of the second wavelength.

The fifth aspect of the present invention is the method for manufacturing an organic electroluminescence display according to the fourth aspect, wherein, in the fourth step and fifth steps, the first and second light emitting layers are formed by transferring the ink including the first colorant and the ink including the second colorant, respectively, from a transfer body to the substrate.

The sixth aspect of the present invention is the method for manufacturing an organic electroluminescence display according to the fifth aspect, wherein a width of a pattern of the ink transferred from the transfer body to the substrate is longer than a distance between adjacent partition walls.

The seventh aspect of the present invention is the method for manufacturing an organic electroluminescence display according to the third aspect, wherein, in the fifth step, the second light emitting layer is formed so as to overlap the first light emitting layer wherein an overlapping point of the first light emitting layer and the second light emitting layer is above the underlayer formed on the partition wall.

The eighth aspect of the present invention is the method for manufacturing an organic electroluminescence display according to the third aspect, wherein the first light emitting layer and the second light emitting layer are formed by a relief printing method.

The ninth aspect of the present invention is the method for manufacturing an organic electroluminescence display according to the third aspect, wherein, in the third step, the underlayer is formed by a relief printing method.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3 is a cross sectional diagram showing a structure of an organic EL display 100a.

FIG. 14 is a cross sectional diagram showing a cause of a color mixture in an organic EL display manufactured in Comparative Example 1.

FIG. 15 is a cross sectional diagram showing a cause of a color mixture in an organic EL display manufactured in Comparative Example 1.

1a . . . a base material layer of a relief printing plate, 1b . . . a convex part forming material layer, 2 . . . an ink tank, 3 . . . an ink ejection part, 4a . . . an ink, 5 . . . an anilox roll, 6 . . . a plate cylinder, 7 . . . a body to be printed, 8 . . . a platen for fixing a body to be printed, 9 . . . a doctor, 10 . . . a substrate, 11a, 11b, 11c and 11d . . . a partition wall, 12a, 12b and 12c . . . a first electrode, 13 . . . a hole transport layer, 14R, 14G and 14B . . . a light emitting layer, 15 . . . a second electrode, 16 . . . a sealing resin, 17 . . . a sealing substrate, 18 . . . an underlayer, 19 . . . an organic electroluminescence element, 100a and 100b . . . an organic electroluminescence display, S . . . a relief printing plate.

DETAILED DESCRIPTION OF THE INVENTION

Hereinafter, embodiments of the present invention are explained using the figures. In addition, the present invention is not limited to these embodiments.

Figure 1:
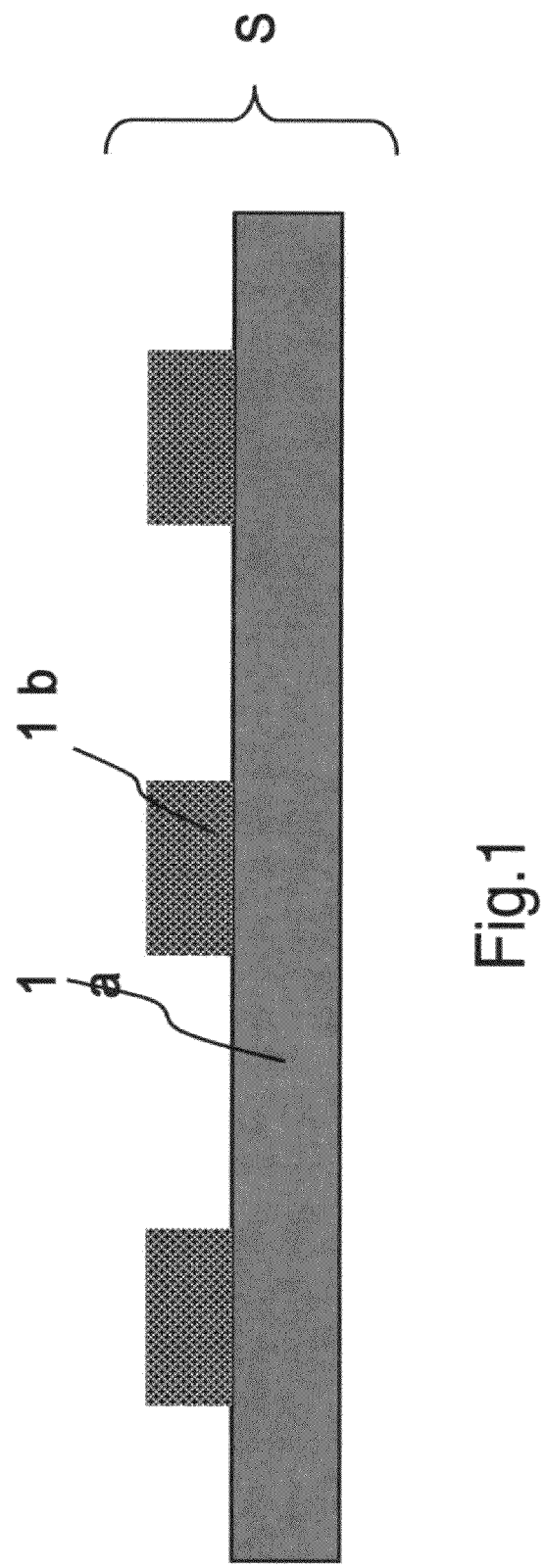
FIG. 1 is a cross sectional diagram of a relief printing plate used in an apparatus for manufacturing an organic EL display.

First, a relief printing plate used in one embodiment of the present invention is described. FIG. 1 is a sectional side view of a relief printing plate for manufacturing an organic EL display of one embodiment of the present invention. In FIG. 1, 1a is a base material layer of a relief printing plate, 1b is a convex part forming material layer (a convex part) on the base material layer 1a. A relief printing plate S is comprised of both the base material layer 1a and the convex part forming material layer 1b.

Rubbers such as butadiene acrylonitrile rubber, silicone rubber, isoprene rubber, styrene-butadiene rubber, butadiene rubber, chloroprene rubber, isobutylene-isoprene rubber, acrylonitrile rubber, ethylene propylene rubber and urethane rubber, synthetic resins such as polyethylen, polystyrene, polybutadiene, polyvinyl chloride, polyvinylidene chloride, polyvinyl acetate, polyamide, polyethersulfone, polyethylene terephthalate, polyethylenenaphthalate, polyethersulfone, polyvinyl alcohol and copolymer thereof, and natural polymers such as cellulose can be used for the convex part forming material layer 1b.

Especially, it is desirable that a material including a water-soluble polymer as a main component should be used, since the material has high resistance to an organic solvent which constitutes a solution or a dispersion of an organic light emitting material which is a component of an ink.

Here, for example, as a coating ink liquid of an organic light emitting material which is one of electronic materials, a material which has the merit the lower the boiling point is, the easier the drying process is performed is used. However, considering time required for a printing process, when a solvent which has a very low boiling point is used, an ink is dried on an upper part of the relief printing plate. Therefore, ink is reasonably mixed with a solvent having a boiling point of 130 degrees Celsius or more. Thereby, ink is prevented from drying.

Examples of solvents having a boiling point of 130 degrees Celsius or more include 2,3-dimethylanisole, 2,5-dimethylanisole, 2,6-dimethylanisole, trimethyl anisole, tetralin, methyl benzoate, ethyl benzoate, cyclohexylbenzene, n-amyl benzoate, tert-amyl benzene, diphenyl ether and dimethyl sulfoxide. One or a plurality of solvent can be selected among them.

Light emitting materials dissolving in the above solvents obtainable by dissolving a low molecular fluorescent dye into a polymer such as polystyrene, polymethylmethacrylate, polyvinylcarbazole and polymer light emitters such as a polyphenylenevinylene (PPV) derivative and a polyalkylfluorene (PAF) derivative are usable. Since it is possible to form a film from these high molecular (polymer) light emitting materials (high molecular light emitting materials for EL elements) by a coating process or a printing process by dissolving the high molecular material into a solvent to make an ink, the high molecular light emitting materials have advantages of enabling film formation under atmosphere conditions and low installation costs as compared to the cost of manufacturing the organic EL display using the low molecular materials.

The above-mentioned materials can be used for a relief printing plate S. However, a flexo printing plate or a resin type relief printing plate which is commercially available can be used for a relief printing plate S.

A method for forming a relief printing plate is as follows. A material of a convex part forming material layer 1b on a base material layer 1a is pattern-exposed and cured using a photo mask. An uncured resin is washed away in developing. Relief formation can be performed by a photolithography method (after developing, drying and exposure are performed, thereby a relief of a predetermined pattern is formed), a laser ablation method, a cutting operation or well-known methods. However, in view of ease, a photolithography method using a light sensitive resin is desirable. A printing machine equipped with a relief printing plate can be used for printing in a relief printing method. For example, a relief printing plate can be equipped with a cylindrically pressing type relief printing machine or a cylindrically pressing type relief offset printing machine to perform printing.

Figure 2:
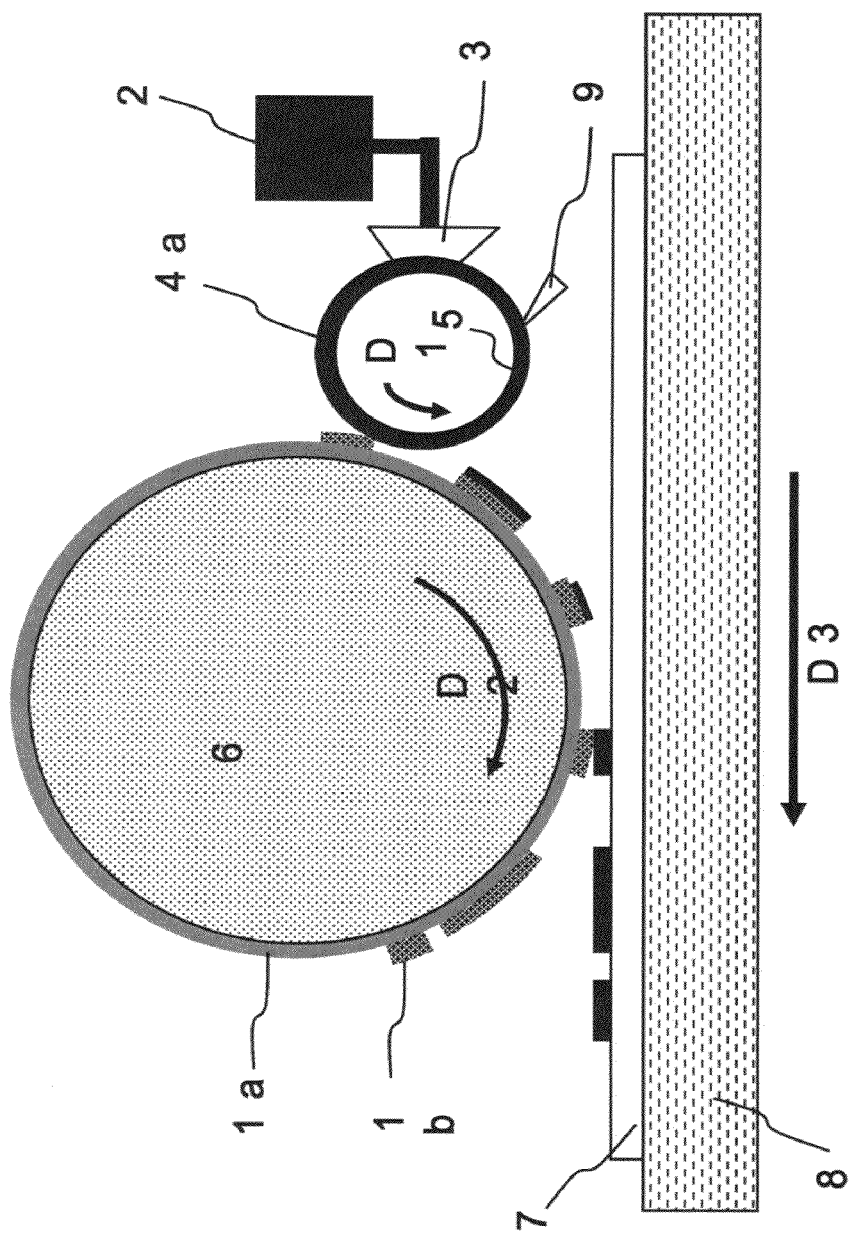
FIG. 2 is a schematic diagram of an apparatus for manufacturing an organic EL display.

FIG. 2 is a schematic diagram of an apparatus for manufacturing an organic EL display of an embodiment of the present invention. An apparatus for manufacturing an organic EL display shown in FIG. 2 is a cylindrically pressing type relief printing machine. As shown in the figure, the machine has an ink tank 2, ink ejecting part 3 (chamber) which supplies an ink, anilox roll 5 which rotates in a direction shown by the arrow D1, the anilox roll 5 comprising a hard type roll made of a metal or a resin, or a soft type elastic roll, and plate cylinder 6 which rotates in a direction shown by the arrow D2, the plate cylinder being capable of having a relief printing plate S (see FIG. 1) thereon. A platen 8 which moves reciprocating a substrate in a direction shown by an arrow D3 (in a horizontal direction) is arranged under the plate cylinder 6, and a body to be printed 7 is fixing upon the platen 8.

An ink including a red light emitting colorant, an ink including a green light emitting colorant and an ink including a blue light emitting colorant are contained in the ink tank 2. Inks of the respective light emitting colorants are individually sent from the ink tank 2 to the ink ejection part 3, in which color mixture does not occur. The anilox roll 5 is near the ink ejection part 3 and rotates while the anilox roll 5 is in contact with a relief printing plate.

While the anilox roll 5 rotates, ink 4a ejected from the ink ejection part 3 to a surface of the anilox roll 5 is scraped and becomes uniform in film thickness. That is, ink 4a of uniform film thickness is transferred to a surface of the anilox roll 5. Thereafter, ink 4a of uniform film thickness on a surface of the anilox roll is transferred to a top surface of the convex part 1b of the relief printing plate arranged on the plate cylinder 6.

Further, the platen 8 for fixing a body to be printed and the body 7 to be printed are horizontally moved towards the left in FIG. 2 for a printing start position, while a position adjustment mechanism adjusts a phase position between a convex pattern comprised of the convex part 1b of the relief printing plate and the body 7 to be printed.

Thereafter, the platen 8 for fixing a body to be printed is horizontally moved towards the left in the figure in accordance with a rotating speed of the plate cylinder 6, while a surface of the body 7 to be printed touches the convex part 1b of the relief printing plate S on the plate cylinder 6 at a predetermined pressure. Thereby, a convex pattern comprised of an ink is printed on a surface of the body 7 to be printed, the ink being on a top surface of the convex part S of the relief printing plate.

After the body 7 to be printed is printed, the body 7 is removed from the platen 8 for fixing a body to be printed. Thereafter, the next body 7 to be printed is fixed on the platen 8 for fixing a body to be printed. Printing is performed by repeating this operation.

Figure 3:
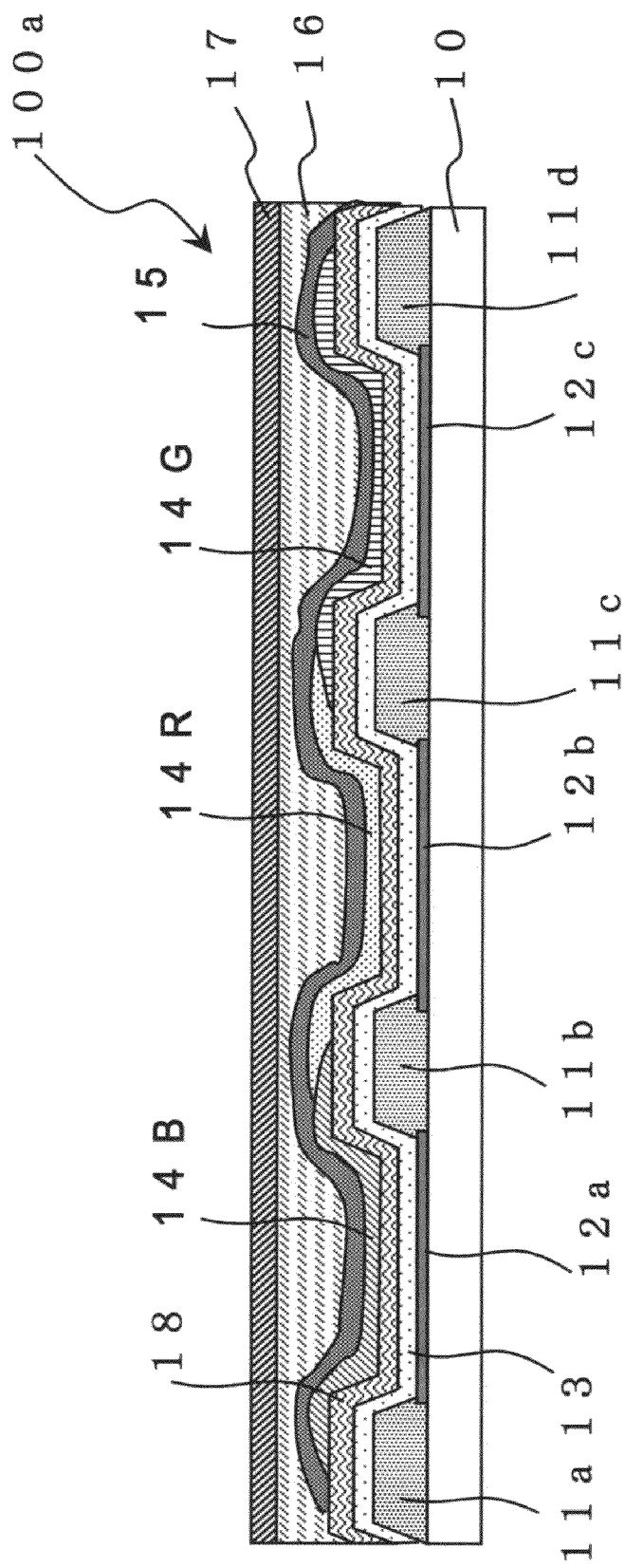

Next, an organic EL display of the present invention is explained. FIG. 3 is a cross-sectional diagram showing a structure of an organic EL display 100a of one embodiment of the present invention. Partition walls 11a, 11b, 11c and 11d having cross trapezoidal section surfaces are formed on a substrate 10 wherein the partition walls are separated from each other by a predetermined distance. In addition, substrate 10 can include TFTs (thin film transistors). First electrodes 12a (layer-shaped) which are pixel electrodes are respectively formed on substrate 10 between partition walls 11a and 11b, between partition walls 11b and 11c and between partition wall 11c and 11d. A layer-shaped hole transport layer 13 is formed entirely above partition walls 11a, 11b, 11c, 11d and first electrodes 12a, 12b, 12c. Further, a layer-shaped underlayer 18 is formed entirely above partition walls 11a, 11b, 11c, 11d and the hole transport layer 13.

A light emitting layer 14B is formed on an underlayer 18 above partition walls 11a, 11b and the hole transport layer 13 by applying an ink including an organic light emitting material including a colorant which emits blue light. A light emitting layer 14G is formed on an underlayer 18 above partition walls 11c, 11d and the hole transport layer 13 by applying an ink including an organic light emitting material including a colorant which emits green light. A light emitting layer 14R is formed on an underlayer 18 above partition walls 11b, 11c and the hole transport layer 13 by applying an ink including an organic light emitting material including a colorant which emits red light. In addition, application of inks above partition walls 11a, 11b and the hole transport layer 13 is performed in the order of blue, green and red. Therefore, the light emitting layer 14R overlaps the light emitting layer 14B above the partition wall 11b. In addition, the light emitting layer 14R overlaps the light emitting layer 14G above the partition wall 11c. In addition, the light emitting layer 14G overlaps the light emitting layer 14B above the partition wall 11d.

A layer-shaped second electrode 15 (a counter electrode) is formed on light emitting layers 14B, 14G and 14R. A layer of a sealing resin 16 is formed on the second electrode 15. A sealing substrate 17 is formed on the sealing resin 16. In the organic EL display 100a, a region between partition walls 11a and 11b, a region between partition walls 11b and 11c and a region between partition walls 11c and 11d are organic EL elements.

Next, this embodiment of a method for manufacturing an organic EL display 100a is explained. First, a substrate 10 is prepared. Trapezoidal partition walls 11a, 11b, 11c and 11d are formed on the substrate 10 so as to be between adjacent organic EL elements, in which there is a predetermined space between partition walls. Next, layers of first electrodes 12a, 12b and 12c (first electrode layers) are formed at regions between partition walls 11a, 11b, 11c and 11d. The hole transport layer 13 is formed on partition walls 11a, 11b, 11c and 11d and first electrodes 12a, 12b and 12c. Then, the underlayer 18 is formed on an entire surface including surfaces of partition walls 11a, 11b, 11c and 11d and a surface of the hole transport layer 13.

The light emitting layer 14B is formed by applying a pattern of an ink 4a including a colorant which emits blue light to both a region on partition walls 11a, 11b and a region between partition walls 11a, 11b. After the ink 4a including a colorant which emits blue light is solidified and dried, a pattern of the ink 4a including a colorant which emits green light having a longer wavelength than blue is applied to both region on partition walls 11c, 11d and a region between partition walls 11c, 11d so that the ink 4a at least partially overlaps the light emitting layer 14B. In this way, a light emitting layer 14G is formed. After the ink 4a including a colorant which emits green light is solidified and dried, a pattern of the ink 4a including a colorant which emits red light having a longer wavelength than green is applied to both region on partition walls 11b, 11c and a region between partition walls 11b, 11c so that the ink 4a at least partially overlaps the light emitting layer 14B or the light emitting layer 14G. In this way, the light emitting layer 14R is formed.

After the ink 4a including a colorant which emits red light is solidified and dried, a layer of a second electrode 15 is formed on light emitting layers 14R, 14G and 14B. Then, a layer of a sealing resin 16 is formed on the second electrode 15. Thereafter, a sealing substrate 17 is arranged on a layer of the sealing resin 16.

In addition, in FIG. 3, the ink 4a can be applied to an entire surface on partition walls 11a, 11b, 11c and 11d. In this structure, the following advantages (A1), (A2) and (A3) can be obtained.

(A1) Light emitting layers 14R, 14G and 14G have an insulating property. Therefore, a leakage current from first electrodes 12a, 12b, 12c, the second electrode 15 or the hole transport layer 13 can be cut off.

(A2) In the case where first electrodes 12a, 12b, 12c have a resin property, a gas is generated from partition walls 11a, 11b, 11d, thereby an organic EL element may be damaged. However, in the case where light emitting layers 14R, 14G, 14B cover the entire surface above partition walls 11a, 11b, 11c, 11d, the damage can be controlled.

(A4) Wettablity of a surface of an organic EL element becomes uniform. Thereby, uniform film formation becomes possible and therefore, disconnection can be controlled. That is, edges of partition walls 11a, 11b, 11c, 11d are covered by light emitting layers. Therefore, disconnection of the second electrode 15 formed thereon can be controlled.

An organic EL element for an organic EL display 100a includes a conductive organic light emitting medium layer (light emitting layers 14R, 14G, 14B in FIG. 3), electrode layers (electrodes 12a, 12b, 12c in FIG. 3) and a counter electrode 15 (a second electrode 15 in FIG. 3) arranged at both sides of the organic light emitting medium layer. The element is manufactured as follows. An electrode layer, an organic light emitting medium layer, a counter electrode layer are formed on a substrate 10 in this order. A voltage is applied to the organic light emitting medium layer, thereby an electron and a hole are injected and recombined. At the time of recombination, the organic light emitting medium layer emits light. Here, in order to increase light emitting efficiency, a hole transport layer 13 is arranged between electrode layers (first electrodes 12a, 12b, 12c) and organic light emitting medium layers (light emitting layers 14R, 14G, 14B). However, an electron transport layer can be arranged between a counter electrode (a second electrode 15) and organic light emitting layers (light emitting layers 14R, 14G, 14B).

Next, the organic EL display 100a of this embodiment is described in detail in order beginning from a substrate 10.

In the case where a driving type of an organic EL apparatus is an active matrix type, the substrate 10 is as follows. A thin film transistor (TFT) is formed on a glass or quartz, a plastic film such as polyethersulfone or polycarbonate. In addition, a thin film transistor is not especially shown in Figures.

Well-known thin film transistors can be used as the thin film transistor provided on the substrate 10. For example, a thin film transistor having the active layer where a source/drain region and a channel area are formed, the gate insulating film and the gate electrode is exemplified. Configuration of a thin film transistor is not limited to this configuration. For example, staggered type, reverse staggered type, top gate type, and coplanar type are exemplified.

In addition, the organic EL display 100a can be an active matrix type or a passive matrix type. In an active matrix type, thin film transistors are formed for respective pixels, and respective pixels independently emit light. In a passive matrix type, stripe-shaped anodes and cathodes are perpendicular to each other, and light is emitted at the intersection points.

The active layer used for a thin film transistor is not particularly limited, but can be formed with, for example, an inorganic semiconductor material such as amorphous silicon, polycrystalline silicon, microcrystalline silicon or cadmium selenide, or an organic semiconductor material such as a thiophene oligomer or poly(p-phenylenevinylene). The active layer may be formed by, for example, a method which comprises laminating amorphous silicon by a plasma CVD method and subjecting to ion doping; a method which comprises forming amorphous silicon by an LPCVD method using a $SiH_4$ gas, obtaining polysilicon through crystallization of the amorphous silicon by a solid phase growth process, followed by subjecting to ion doping by an ion implantation process; a method which comprises forming amorphous silicon by an LPCVD method using a $Si_2H_6$ gas or by a PECVD method using a $SiH_4$ gas, annealing with a laser such as excimer laser, crystallizing the amorphous silicon to obtain polysilicon, followed by subjecting to ion doping by an ion doping process (low temperature process); a method which comprises laminating polysilicon by a low pressure CVD method or an LPCVD method, thermal oxidation at 1000° C. or higher to form the gate insulating film, forming the gate electrode of n+ polysilicon thereon, followed by subjecting to ion doping by an ion implantation process (high temperature process); or the like.

A gate insulating film which has been generally used as the gate insulating film can be used, and for example, $SiO_2$ formed by a PECVD method or an LPCVD method; $SiO_2$ obtained by subjecting a polysilicon film to thermal oxidation; or the like may be used.

A gate electrode which has been generally used as the gate electrode can be used, and examples thereof include metals such as aluminum and copper; high melting point metals such as titanium, tantalum and tungsten; polysilicon; silicide and polycide of a high melting point metal; and the like. Also, the thin film transistor may have a single gate structure, a double gate structure, or a multi gate structure having three or more gate electrodes. In addition, it may also have an LDD structure or an offset structure. Moreover, two or more thin film transistors may be disposed in one picture element.

According to the organic EL display 100a of the invention, the thin film transistor must be connected so as to function as a switching element of the organic EL element, and the drain electrode of the transistor is electrically connected to the first electrode (12a, 12b and 12c) of the organic EL element. The connection of the thin film transistor and the drain electrode and the first electrode of the organic EL element may be carried out via a connection wire formed in the contact hole that penetrates into the planarized film.

The first electrode (12a, 12b, 12c) is formed on a substrate 10, and patterning thereof is performed according to necessity. In the case where a partition wall is formed on the substrate 10, the first electrode is sectioned by a partition wall (11a, 11b, 11c, 11d), and becomes the first electrode corresponding to each pixel. A material of the first electrode which can be used is any one of: metal complex oxides such as ITO (indium-tin complex oxide), indium-zinc complex oxide and zinc-aluminum complex oxide; metal materials such as gold and platinum; and fine grain dispersion films produced by dispersing fine grains of such a metal oxide or a metal material in an epoxy resin or an acrylic resin and laminating the dispersion to form a monolayer or multilayers. When the first electrode is an anode, it is desirable to select the material such as ITO which has a high work function. In the case of a so-called bottom emission configuration in which light is taken out from a lower side, it is necessary to select a material with translucency such as ITO. Here, in the case of a top emission configuration in which light is taken out from an upper side, reflectivity is necessary. Therefore, a metal material such as Ag or Al on which an ITO film is formed can be used. If necessary, in order to reduce wire resistance of the first electrode, a metal material such as Cu or Al can be added as an assisting electrode.

The following methods can be used for a formation method of the first electrode depending on the material: dry methods such as resistance heating evaporation method, electron-beam evaporation technique, reactivity evaporation method, ion plating method and sputtering method; and wet methods such as the gravure process and screen printing. Using these methods, the first electrode is formed on the substrate 10. However, the formation method of the first electrode is not limited to these.

Existing patterning methods such as mask evaporation method, photolithography method, wet etching method and dry etching method can be used for a patterning method of the first electrode layer (12a, 12b and 12c), depending on a material and a film formation method. In a case where a product with a TFT is used as a substrate, the product with a TFT should be formed so that a pixel electrode is electrically connected to a corresponding pixel in a lower layer.

Partition walls (11a, 11b, 11c and 11d) can be formed so as to section a light emitting area corresponding to a respective pixel. In an active matrix drive-type display device, first electrode layers are generally formed for respective pixels and the respective pixel tends to occupy as large an area as possible. Therefore, the most preferable shape of a partition wall to be formed so as to cover an edge of a pixel electrode is basically a grid shape where a partition wall sections at the shortest distance of respective first electrode layers.

A photosensitive resin for forming partition walls (11a, 11b, 11c, 11d) can be a positive resist or a negative resist. A photosensitive resin having an insulating property can be used. In the case where a partition wall does not have a sufficient insulating property, if a voltage is applied to a pixel, current flows to an adjacent pixel, a partition wall being arranged between the pixel and the adjacent pixel, through a partition wall. Therefore, display failure occurs. Examples of a photosensitive resin for forming a partition wall include a resin such as a polyimide system, an acrylic resin system, a novolac resin system, a fluorene system. However, the Examples are not limited to these. In addition, for the purpose of improving a display quality of an organic EL element, a light shielding material can be included in a photosensitive resin.

A method for forming partition walls (11a, 11b, 11c, 11d) can be a conventional method as follows. An inorganic film is uniformly formed on a base body and masked by a resist. Thereafter, dry etching is performed. Alternatively, a photosensitive resin is formed on a base body. Thereafter, a predetermined pattern is formed by a photolithography method. If necessary, an water-repellent agent can be added, or it is irradiated with plasma or UV. Thereby, it can have a liquid-repellent property.

A preferable height of a partition wall (11a, 11b, 11c and 11d) is equal to or more than 0.1 μm and equal to or less than 10 μm. More preferably, it is 0.5-2 μm. In the case where a height of a partition wall is more than 10 μm, formation of a counter electrode and sealing are prevented. In the case where a height of a partition wall is less than 0.1 μm, a partition wall can not fully cover an edge of a first electrode layer, or short circuit between adjacent pixels and a color mixture may occur in the case of forming of a light emitted medium layer.

The second electrode 15 is formed on an organic light emitting medium layer. When the second electrode 15 is a cathode, the material discussed below can be used. The material can be of a type with high electron injection efficiency to an organic light emitting medium layer and low work function. In some embodiments, the second electrode 15 can include a metal such as Mg, Al, Yb. In addition, the following layer stack may be put in a boundary surface of the luminescent medium. The layer stack is that with a chemical compound of about 1 nm thicknesses such as Li and oxidation Li, LiF and Al and Cu of stability and/or high conductivity. Stability should be balanced with electron injection efficiency. Therefore an alloy system may be used. An alloy of more than one kind of metal such as Li, Mg, Ca, Sr, La, Ce, Er, Eu, Sc, Y, and Yb that have a low work function, and metallic elements such as Ag, Al, and Cu which are stable can be used. In some embodiments, alloys such as MgAg, AlLi, and CuLi can be used. However, materials are not limited to these. In the case of a bottom emission type, a metal material such as Ag or Al can be formed as a reflection layer.

Depending on the material, a resistance heating evaporation coating method, an electron beam-evaporation coating method, a reactive deposition method, an ion plating method, or a sputtering method can be used for the method of forming the second electrode 15. However, the method for forming the second electrode 15 is not limited to these.

Next, an organic light emitting medium layer is formed. An organic light emitting medium layer may include only a single layer of an organic light emitting layer. An organic light emitting medium layer may have a laminated structure combined with an organic light emitting layer and a layer to assist light emitting such as a hole transport layer, a hole injection layer, an electron transport layer and an electron injection layer. In addition, the layer which assists light emitting such as a hole transport layer, a hole injection layer, an electron transport layer and an electron injection layer is selected appropriately.

The following materials can be used for a light emitting material which is used for an organic light emitting layer of an organic EL element: a low molecular light emitting coloring matter such as coumarin system, perylene system, pyran system, anthrone system, porphyrin system, quinacridon system, N,N'-dialkyl permutation quinacridon system, naphthalimido system, N,N'-diaryl permutation pyrrolo pyrrole series, iridium complex system, platinum complex system or europium complex system is dissolved in or copolymerized with polymers such as PS, polymethyl methacrylate or polyvinyl carbazole. In addition, polymer light emitting materials such as poly arylene system, PAV [polyarylenevinylene] system or poly fluorene system can be used.

In addition, the following low molecular type luminescent materials which are scattered in a polymeric material can be used: coumarin corollary fluorescent substance, perylene corollary fluorescent substance, pyran type fluorescent substance, anthrone corollary fluorescent substance, porphyrin corollary fluorescent substance, quinacridon corollary fluorescent substance, N,N'-dialkyl displacement quinacridon corollary fluorescent substance, naphthalimido corollary fluorescent substance, N,N'-diaryl displacement pyrrolo pyrrole series fluorescent substance and phosphorescence fluor such as Ir chelate. Polystyrene, polymethyl methacrylate and polyvinylcarbazole can be used as a polymeric material. In addition, poly arylene type, poly arylenevinylene type, poly fluorene, polyphenylene vinylene, polyparaphenylene vinylene, polythiophene, and polyspiro can be used as polymer light emitting material. In addition, materials in which the polymer light emitting material is dispersed in the low molecular material or co-polymerized low molecular material, or other existing light emitting material can be used.

Materials generally used for a hole transport material can be used for a material of a hole transport layer 13. Copper phthalocyanine and the derivative, and Low molecular weight material such as the following aromatic amine system can be used: 1,1-bis((4-di-p-tolylamino phenyl)Cyclohexane)cyclohexane; and N,N'-diphenyl-N,N'-bis((3-methylphenyl))-1,1'-biphenyl-4,4'-diamine; and N,N'-di(one-naphthyl)-N,N'-diphenyl-1,1'-biphenyl-4,4'-diamine. However, in view of film formation, the following high molecular weight materials are preferable: a polyaniline derivative; a polythiophene derivative; a polyvinylcarbazole (PVK) derivative; and a mixture (PEDOT/PSS) of poly (3,4-ethylenedioxythiophene) (PEDOT) and polystyrene sulfonic acid (PSS). In addition, the following materials can be used: a low-molecular material showing a charge transport property such as aryl amines, carbazoles, aryl sulfide, thiophenes or phthalocyanines is mixed with an electroconductive polymer such as poly arylene system such as polyparaphenylene (PPP) or PAV [polyarylenevinylene] system such as polyphenylene vinylene (PPV) or polymers such as polystyrene (PS).

Further, inorganic materials can be used for the hole transport layer 13. Examples thereof are as follows: Alkali metal such as Li, Na, K, Rb, Ce and Fr; alkaline earth metallic elements such as Mg, Ca, Sr and Ba; lanthanoid system element such as La, Ce, Pr, Nd, Sm, Eu, Gd, Db, Dy, Ho, Er, Tm, Yb and Lu; actinoid system element such as Th; metallic elements such as Sc, Ti, V, Cr, Fe, Co, Ni, Cu, Zn, lateral, Ar, Nb, Mo, Ru, Pd, Ag, Cd, Hf, Ta, W, Re, Os, Ir, Pt, Au, Al, Ga, In, Sn, Tl, Pb and Bi; half metallic elements such as B, Si, Ge, As, Sb and Te; alloys thereof; and inorganic compounds thereof such as oxide, carbide, nitride, boride, sulfide and halide.

Among them, especially, molybdenum oxide can be easily used in film formation. A hole injection function from a hole injection electrode is high. Its function is superior in that a hole is stably transported. In view of stability or the like, it is known as a useful material as a hole transport material or an electron injection material.

In the case where an inorganic material is used for a hole transport material, for example, metal oxides such as $Cu_2O$, $Cr_2O_3$, $Mn_2O_3$, $FeOx(x\sim0.1)$, NiO, CoO, $Pr_2O_3$, $Ag_2O$, $MoO_2$, $Bi_2O_3$, ZnO, $TiO_2$, $SnO_2$, $ThO_2$, $V_2O_5$, $Nb_2O_5$, $Ta_2O_5$, $MoO_3$, $WO_3$ and $MnO_2$ can be formed on the entire surface of a first electrode and a partition wall by a vacuum vaporization method, a sputtering method and a CVD (chemical vapor deposition) method. However, a material is not limited to the above materials.

In the case where an organic material is used for a hole transport material, for example, a polyaniline derivative, a polythiophene derivative, a polyvinylcarbazole (PVK) derivative, poly(3,4-ethylenedioxythiophene) or the like is dissolved or dispersed into a solvent to obtain a positive hole transport material ink, and it is possible to form a hole transport layer by applying the ink on the entire surface of a first electrode and a partition wall by a spin coat method or various printing methods. However, a material is not limited to the above materials.

Next, an underlayer 18 is formed between an organic light emitting layer and a hole transport layer of an organic EL element. In the case where an underlayer is formed at a region including a first electrode and a partition wall, wettablity of an electrode and a partition wall is uniform. In the case where an organic light emitting layer is formed, an ink of an organic light emitting material spreads uniformly. Therefore, a film thickness of an organic light emitting layer becomes uniform. In addition, such an underlayer increases hole transport properties and acts as a buffer layer blocking an electron from a second electrode. Thereby, a light emitting efficiency of an organic light emitting layer is increased, and driving life time is extended.

Next, a material of an underlayer is explained. In the case where an inorganic material is used, oxide, nitride and oxynitride of Cr, W, V, Nb, Ta, Mo, Ti, Zr, Hr, Sc, Y, Mn, Fe, Ru, Os, Co, Ni, Cu, Zn, Cd or the like can be formed by a vacuum evaporation method. In this case, if an arbitrary shadow mask is used, formation is possible at one time. If an underlayer comprised of an inorganic material is arranged, a stable organic EL element superior in stability or resistance can be obtained.

In the case where an organic material is used, polyvinylcarbazole, derivative of polyvinylcarbazole, polyarylene derivative having aromatic amine at a main chain or a side chain, and polymers having aromatic amine such as aryl amine derivative and triphenyl diamine derivative can be used. However, usable materials are not limited to these.

If a film forming method of an organic light emitting material formed on an underlayer is considered, solubility in an organic light emitting ink solvent such as toluene or xylene is preferably low, for example, 1 wt % or less. Further, in order to form an organic light emitting layer of a uniform film thickness, an underlayer material having a wettability such that a contact angle of an underlayer and an organic light emitting material ink is 0-15 degrees is preferably selected.

As a printing method for forming an underlayer using an organic material, a relief printing method superior in pattern formation accuracy and uniformity of a film thickness is preferable. Patterning at a pixel part is not necessary for the underlayer in the present invention. Therefore, general coating methods such as a spin coat method or bar coat method can be used. However, a relief printing method is preferable in order that a part of a fetch wire or a part for connecting to a driver is not covered.

In the case where an underlayer is formed by a relief printing method, firstly, stripe-shaped convex parts of a resin relief printing plate are set to correspond to lines comprised of aligned RGB pixels so that the stripe is perpendicular to a direction of a long side of a RGB pixel, and an underlayer ink is transferred to a substrate. In this way, an underlayer can be formed on the entire surface of a pixel and a partition wall.

In this way, an underlayer is formed on an organic EL element and a partition wall in a direction of a short side of an organic EL element. Thereby, wettability of a light emitting layer forming region becomes uniform, and a light emitting layer of a uniform film thickness can be formed. Further, in the present invention, a second light emitting layer is formed so as to partially overlap a first light emitting layer. Therefore, wettability of an underlayer is set higher than wettability of a first light emitting layer, thereby a second light emitting layer of a uniform film thickness can be formed.

Representative examples of a material of an electron transport layer include 2-(4-biphenyl)-5-(4-t-butylphenyl)-1,3,4-oxadiazole, 2,5-bis(1-naphthyl)-1,3,4-oxadiazole, Oxadiazoles, Bis(10-hydroxybenzo[h]quinolinate)beryllium complex, triazole compound, and combinations thereof.

In the case where these materials are inorganic materials, the materials can be deposited by a sputtering method, a CVD method or the like. In the case where these materials are low molecular type, the materials can be deposited by a vaporization method. On the other hand, these materials can be dissolved or dispersed in a single solvent or a mixed solvent selected from toluene, xylene, acetone, anisole, methyl anisole, dimethylanisole, benzoic ether, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate, water or the like so as to be a coating liquid, and the liquid is applied by a coating method such as a spin coat method, a curtain coat method, a bar coat method, a wire coat method and a slit coat method, or a printing method such as a letterpress printing (flexographic printing method), an intaglio offset printing, a letterpress reverse offset printing, an ink jet printing and an intaglio printing method.

In addition, in this embodiment, an organic EL display with a structure shown in FIG. 3 is described. However, the present invention is not limited to this structure. For example, a structure of an organic EL display can have the structure as shown in FIG. 4 described below.

Figure 4:
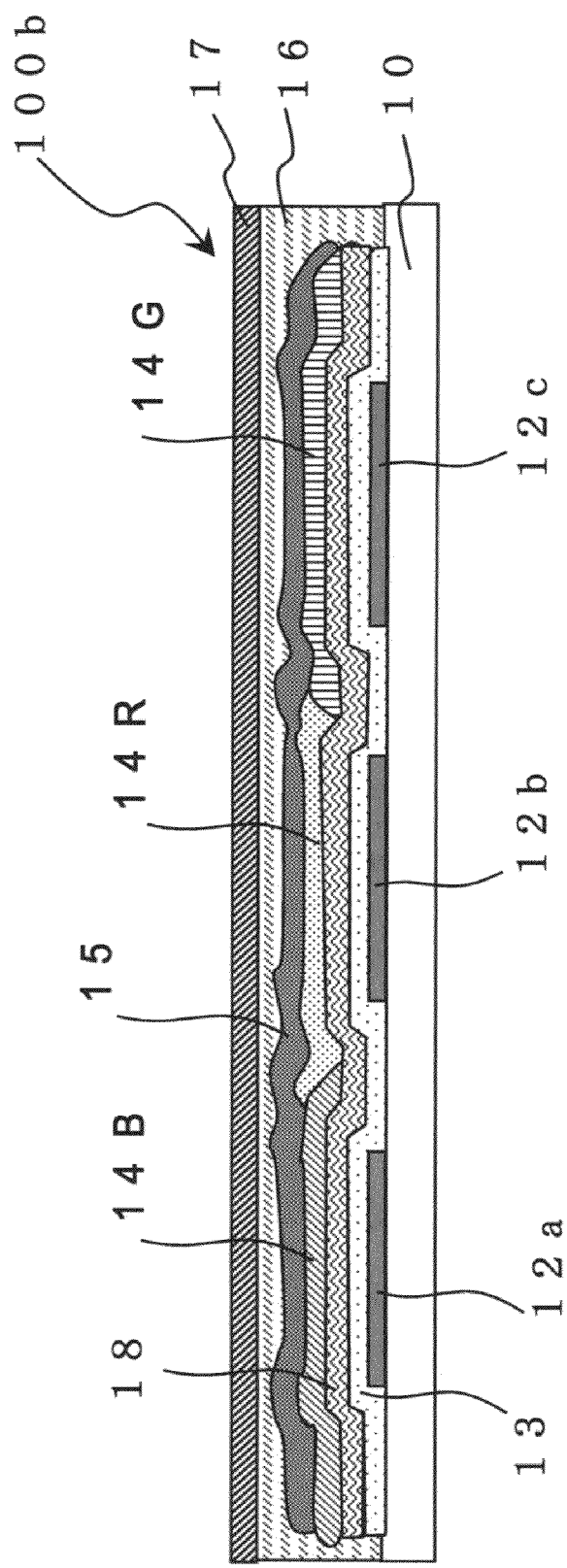
FIG. 4 is a cross sectional diagram showing a structure of an organic EL display 100b.

FIG. 4 is a cross sectional view showing a structure of an organic EL display 100b of a modified embodiment of the present invention. In FIG. 4, the same symbol is used for the same part shown in FIG. 3 while explanation of the same part is omitted. In the organic EL display 100b of FIG. 4, partition walls 11a, 11b, 11c and 11d are not formed on the substrate 10. This point is different from the organic EL display 100a of FIG. 3. The hole transport layer 13 is formed on the substrate 10 and first electrodes 12a, 12b, 12c, that is, on the entire surface of an element. Thereby, wettability of surface of a substrate and inside a pixel can be uniform. Therefore, a film thickness of an underlayer formed directly above them can be uniform. That is, a light emitting layer formed on an underlayer can be stably formed.

Figure 5:
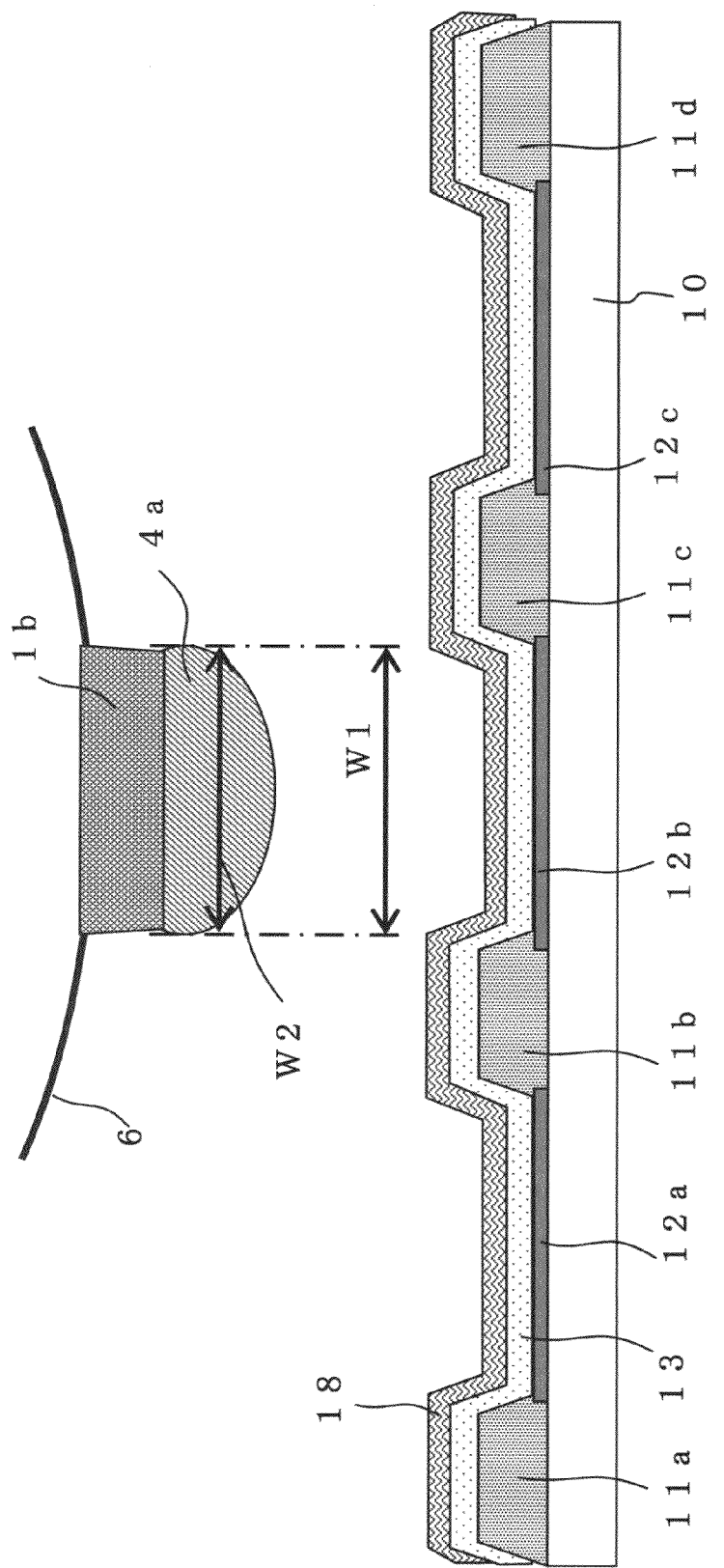
FIG. 5 is a diagram showing a method for manufacturing an organic EL display 100a of FIG. 3.
Figure 6:
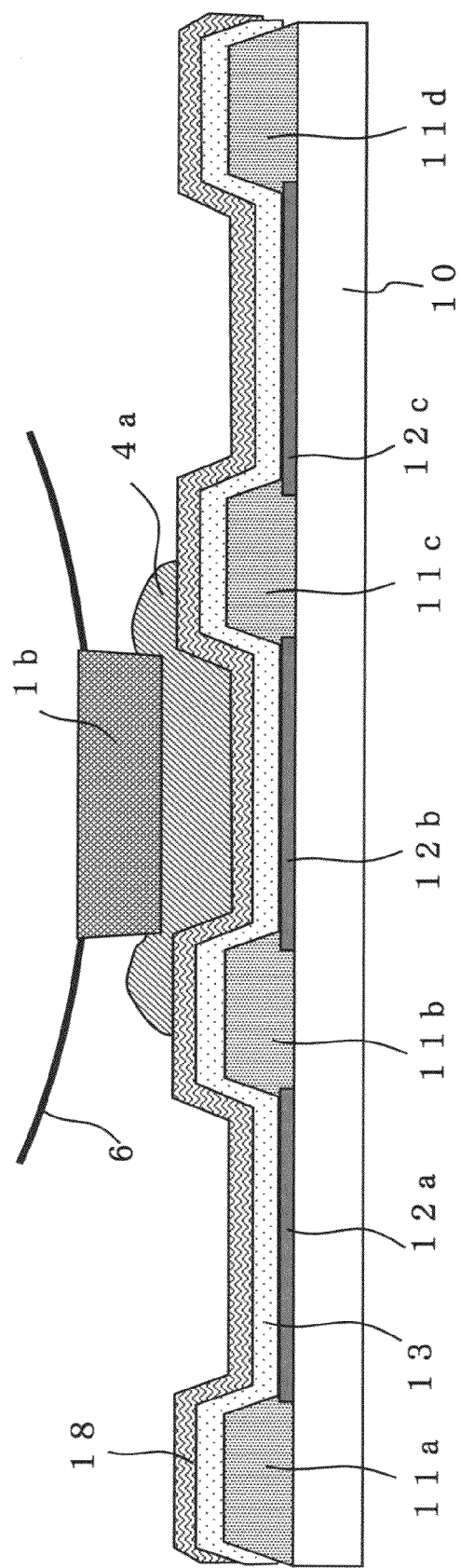
FIG. 6 is a diagram showing a method for manufacturing an organic EL display 100a of FIG. 3.

FIGS. 5 and 6 show a method for manufacturing the organic EL display 100a (FIG. 3) of one embodiment of the present invention. In particular, FIGS. 5 and 6 show a process in which a light emitting layer 14R is formed on an underlayer between partition walls 11b and 11c. In addition, not only the light emitting layer 14R but also light emitting layers 14G and 14B can be formed by the same method as FIGS. 5 and 6. In addition, light emitting layers 14R, 14B and 14G of the organic EL display 100b (FIG. 4) can be formed by the same method as FIGS. 5 and 6.

FIG. 5 is a partial enlarged view of FIG. 2. A body to be printed 7 of FIG. 2 corresponds to the substrate 10, partition walls 11a, 11b, 11c and 11d, first electrodes 12a, 12b and 12c and the hole transport layer 13 of FIG. 5. An ink 4a is arranged on a surface of a relief printing plate forming material layer 1b fixed on a plate cylinder 6 by an anilox roll. In addition, in this embodiment, a width W2 of a relief printing part forming material layer 1b is narrower than a distance between partition walls W1.

The plate cylinder 6 rotates, and a convex part forming material layer 1b reaches a position between the partition wall 11b and the partition wall 11c. At this time, a platen 8 for fixing a body to be printed (not illustrated in FIGS. 5 and 6) makes the substrate 10 etc. contact with the ink 4a. Thereby, ink 4a contacts the hole transport layer 13 on partition walls 11b, 11c and the first electrode 12b. Thereby, a pattern is formed. (See FIG. 7). Instead of using the apparatus shown in FIGS. 5 and 6, the ink 4a can be applied using the apparatus shown in FIGS. 7 and 8.

Figure 7:
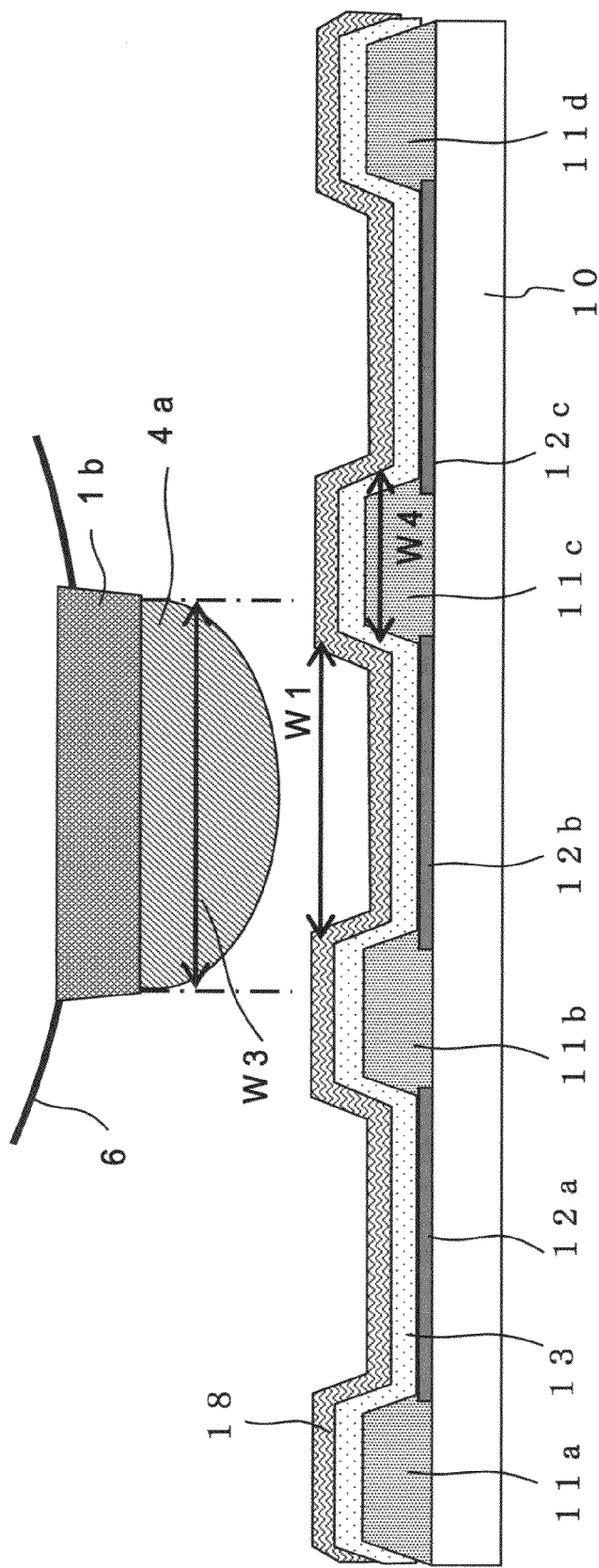
FIG. 7 is a diagram showing another method for manufacturing an organic EL display 100a of FIG. 3.
Figure 8:
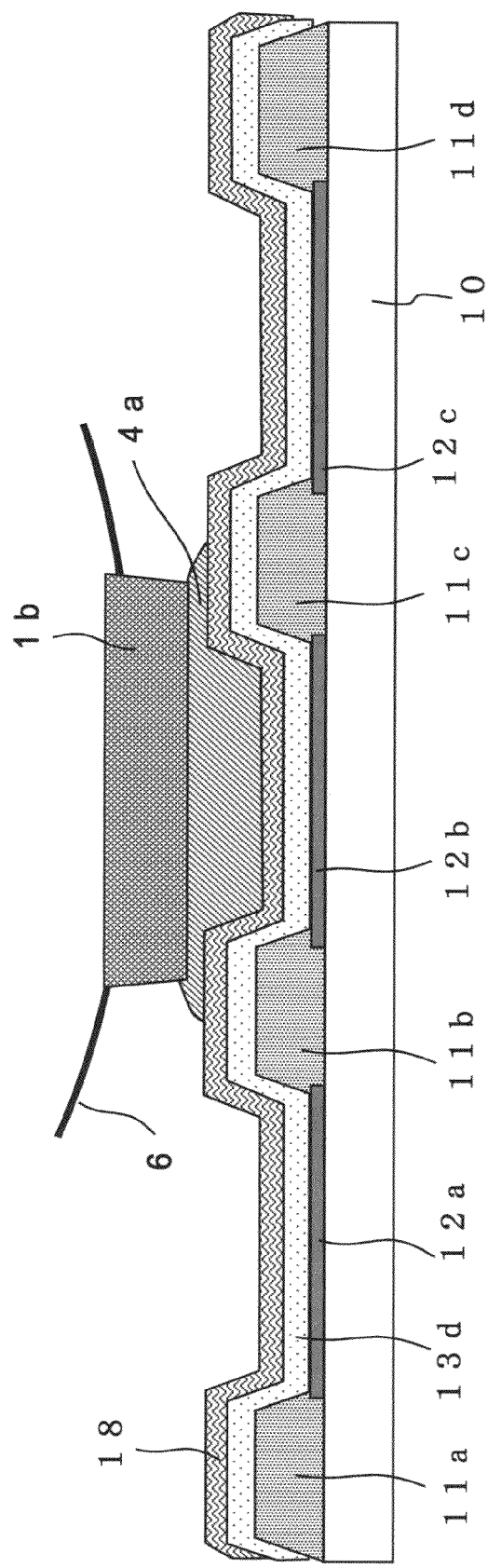
FIG. 8 is a diagram showing another method for manufacturing an organic EL display 100a of FIG. 3.

FIGS. 7 and 8 are figures showing another example of a method for manufacturing the organic EL display 100a (FIG. 3) of one embodiment of the present invention. FIGS. 7 and 8 as well as FIGS. 5 and 6 show a process in which the light emitting layer 14R is formed on the hole transport layer 13 between the partition wall 11b and the partition wall 11c. In FIGS. 7 and 8, identical parts in FIGS. 5 and 6 have identical symbols. The explanation thereof is omitted. In FIGS. 7 and 8, a width W3 of the convex part forming material layer 1b is wider than a distance W1 between partition walls. This is a difference point from FIGS. 5 and 6. In the case where the width W3 of the convex part forming material layer 1b is wider than the distance W1 between partition walls (a pixel width), even if position adjustment between the convex part forming material layer 1b and the substrate 10 is slightly misaligned, flatness in a film thickness of a light emitting layer inside a pixel becomes stable. This is an advantage. This effect is achieved in printing methods other than a relief printing method. That is, as long as a width of an ink pattern which transfers from a transfer body of respective printing methods to a substrate is wider than the distance W1 between partition walls, it is desirable. However, a width obtained by adding a width W2 between partition walls to the distance W1 between partition walls (=W1+2×W2) is necessary to be wider than a width of an ink pattern to be transferred so that the ink 4a does not flow to an adjacent pixel region. More preferably, a width of an ink pattern is equal to or narrower than W1+W2. In addition, the above described width or distance is preferably defined as follows. In the case where a line pattern of a light emitting layer is printed, length is measured according to a cross section surface perpendicular to a direction of the printed line. In the case where a dot pattern is printed, length is measured according to a cross section surface perpendicular in a direction of a short side of the dot pattern. (see FIGS. 9 and 10 described below.)

If the width W3 of the convex part forming material layer 1b becomes wider, it becomes difficult to apply the ink 4a between partition walls. However, when a manufacturing method of this embodiment is used, the following effect is obtained. If the ink 4a is not filled only between partition walls 11b, 11c and the ink 4a is formed on partition walls 11b, 11c, or, the ink 4a flows to an adjacent organic EL element (here, a region between partition walls 11a, 11b, or a region between partition walls 11c, 11d), since an ink of a longer wavelength is applied above an ink of a shorter wavelength, even if position adjustment between the convex part forming material layer 1b and the substrate 10 is slightly misaligned, color mixture between adjacent pixels can be prevented.

Figure 9:
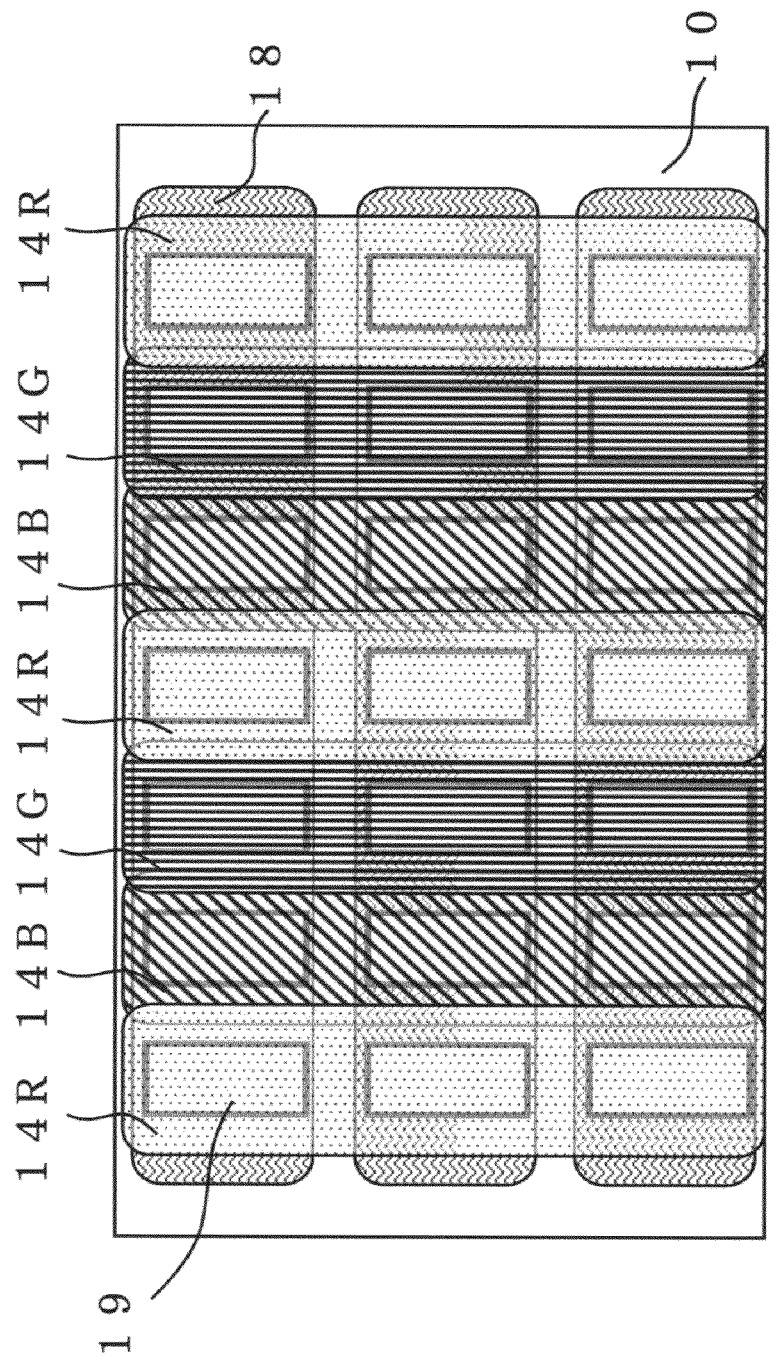
FIG. 9 is a planar view diagram showing a structure of an organic EL display 100a of FIG. 3.

FIG. 9 is a planar view showing a structure of the organic EL display 100a (FIG. 3) of one embodiment of the present invention. In FIG. 9, partition walls 11a, 11b, 11c, 11d . . . , first electrodes 12a, 12b, 12c, . . . , the hole transport layer 13, . . . , the underlayer 18, light emitting layers 14R, 14G and 14B are formed on the substrate 10. In FIG. 9, the second electrode 15, the sealing resin 16 and the sealing substrate 17 are not formed.

In FIG. 9, twenty-one (3×7) organic EL elements are formed on the substrate 10 of the organic EL display 100a. In organic EL elements in a first row, a fourth row and a seventh row, light emitting layers 14R are formed. In organic EL elements in a second row and a fifth row, light emitting layers 14B are formed and in organic EL elements in a third row and a sixth row, light emitting layers 14G are formed.

In FIG. 9, two light emitting layers overlap each other at a border region between respective rows. In particular, the light emitting layer 14G overlaps the light emitting layer 14B at a border region between $2^{nd}$ row and $3^{rd}$ row. In addition, the light emitting layer 14R overlaps the light emitting layer 14G at a border region between $3^{rd}$ row and $4^{th}$ row. In addition, the light emitting layer 14R overlaps the light emitting layer 14B at a border region between $1^{st}$ row and $2^{nd}$ row. Stripe-shaped underlayers 18 are formed so as to cover a side of a partition wall wherein, at the side, light emitting layers overlap each other. That is, in FIG. 9, stripe-shaped underlayers 19 are formed in a direction of a short side of a pixel so as to cover both respective pixels and partition walls between pixels. Stripe-shaped light emitting layers 14R, 14G and 14B are formed so as to be perpendicular to a direction of the stripe-shaped underlayer. In this structure, the overlapping portion of light emitting layers is located on the underlayer, thereby wettability is improved and a very flat light emitting layer can be formed. In addition, an underlayer can be uniformly formed by a printing method such as a relief printing method, compared with the case where an underlayer is entirely formed. In addition, in the case where an underlayer is stripe-shaped, an underlayer can be formed only on a pixel region on an electrode layer and an overlapping portion of light emitting layers on a partition wall. Therefore, in the case where an inorganic material with a low electric resistance is used, leakage current can be controlled. In addition, in FIG. 9, an ink of a light emitting layer is formed for respective rows. However, the embodiment is not limited to these. For example, inks for forming respective light emitting layers can be applied as shown in FIG. 10.

Figure 10:
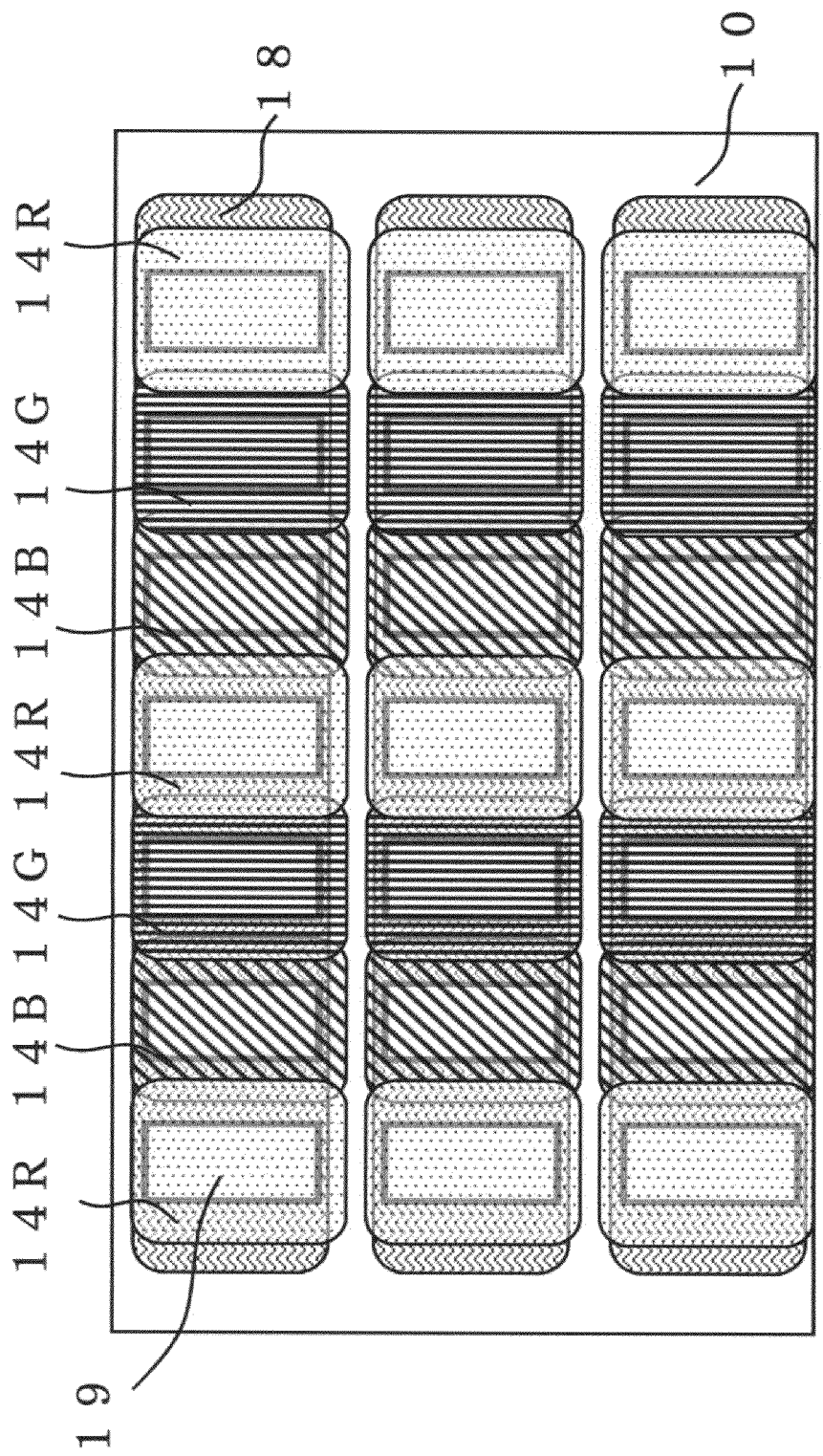
FIG. 10 is a planar view diagram showing another structure of an organic EL display 100a of FIG. 3.

FIG. 10 is a planar view of another example of a structure of the organic EL display 100a (FIG. 3) of one embodiment of the present invention. FIG. 10 is different from FIG. 9 in which light emitting layers are formed for respective rows of organic EL elements. In FIG. 10, respective light emitting layers are formed for respective elements of organic EL elements. In addition, in FIG. 10, two light emitting layers overlap each other at a border region of an organic EL element. In particular, the light emitting layer 14G overlaps the light emitting layer 14B at a border region between $2^{nd}$ row and $3^{rd}$ row of organic EL element. In addition, the light emitting layer 14R overlaps the light emitting layer 14G at a border region between $3^{rd}$ row and $4^{th}$ row of organic EL elements. In addition, the light emitting layer 14R overlaps the light emitting layer 14B at a border region between $1^{st}$ row and $2^{nd}$ row of organic EL element. In addition, it is preferable that, in the case of FIGS. 9 and 10, stripe-shaped underlayers 10 are formed in a direction of a short side of a pixel so that a side of a partition wall in which light emitting layers overlap each other is a long side of a pixel.

Light emitting layers are formed in an order in which a light emitting layer emitting light of a longer wavelength is formed earlier. (light emitting layers of 14R, 14G and 14B. 14R (first), 14B(last)) In this case, for example, when an ink of the light emitting layer 14B is applied, a previously applied ink of the light emitting layer 14R or the light emitting layer 14G is dissolved in an ink of the light emitting layer 14B. In this case, when a voltage is applied between first electrodes 12a, 12b, 12c and the electrode 15, even at a region where the light emitting layer 14B is formed, a colorant of the light emitting layer 14R or the light emitting layer 14G flowing in the light emitting layer 14B emits light. Thereby, color mixture occurs. However, in this embodiment, light emitting layers are formed in the order of 14B, 14G and 14R. Therefore, for example, even if a previously applied ink of the light emitting layer 14B or the light emitting layer 14G is dissolved in an ink of the light emitting layer 14R, light emitting energy of a colorant of the flowing light emitting layer 14B or light emitting layer 14G is high, therefore the flowing light emitting layer 14B or 14G does not emit light while a colorant of the light emitting layer 14R of low light emitting energy preferentially emits light. Therefore, color mixture of emitting light can be prevented, and yield of an organic EL display can be improved.

In addition, in this embodiment, light emitting layers 14R, 14G and 14B are applied not only to a region sandwiched by partition walls but also to a top face of a partition wall. Therefore, even if a printing position of the ink 4a for a light emitting layer is slightly shifted, the entire surface of the region sandwiched by partition walls is applied by the ink 4a. Therefore, position adjustment between the plate cylinder 6 (FIG. 2) and the body to be printed 7 (a substrate 10: FIG. 2) does not have to be perfectly accurate. In addition, even if the ink 4a of emitted light color flows and enters the ink 4a of a light emitting layer of an adjacent element, its influence on emitted light color is small as mentioned above. A film thickness of an ink of a light emitting layer in which the ink is applied to a region sandwiched by partition walls can be adjusted to be uniform.

Figure 11:
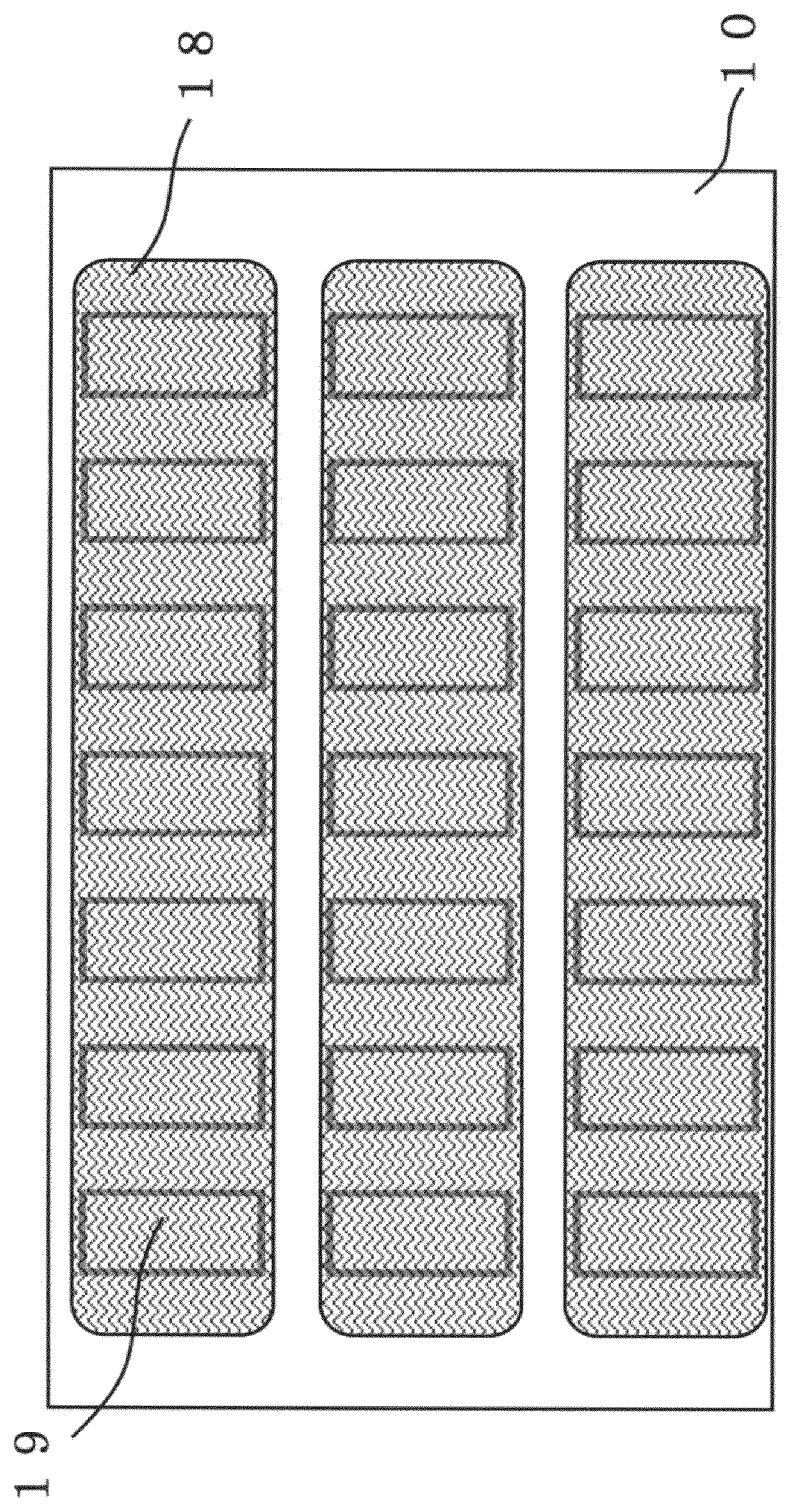
FIG. 11 is a planar view diagram showing a step of forming an underlayer of an organic EL display.

FIG. 11 is a planar view showing a structure of an organic EL display of one embodiment of the present invention. In FIG. 11, partition walls 11a, 11b, 11c, 11d, . . . , first electrodes 12a, 12b, 12c, . . . , the hole transport layer 13 . . . , and the underlayer 18 are formed on the substrate 10. In FIG. 11, light emitting layers 14R, 14G, 14B, the second electrode 15, the sealing resin 16 and the sealing substrate 17 are not formed.

In addition, FIG. 11 shows a state of an underlayer directly under a light emitting layer of FIGS. 9 and 10. An underlayer is formed on the entire surface of a partition wall and an organic EL element, along a row of a direction of a short side of a partition wall and an organic EL element. In this structure, wettability of a surface of a partition wall and an organic EL element can be even, thereby a film thickness of a first light emitting layer formed directly above the partition wall and the organic EL element can be uniform.

In addition, in the above described embodiment, cross-section of partition walls 11a, 11b, 11c and 11d is a trapezoidal shape and a tapered shape. In the case where partition walls has such a shape, respective light emitting layers 14R, 14G and 14B are continuously formed without breaking on partition walls 11a, 11b, 11c and 11d. In addition, cross-sections of partition walls in the above embodiment can be an inverse tapered shape. In such a case, when light emitting layers 14R, 14G and 14B are formed on partition walls 11a, 11b, 11c and 11d, an ink is easily broken by the edges of partition walls 11a, 11b, 11c and 11d. Thereby, a flow of an ink can be controlled, and a color mixture can be prevented.

In addition, in the above embodiments, a height of partition walls 11a, 11b, 11c and 11d is preferably 0.1-5 µm. More preferably, it is 0.5-2 µm. If partition walls 11a, 11b, 11c and 11d are too low, an ink may flow to an adjacent pixel and a color mixture may occur. If partition walls 11a, 11b, 11c and 11d are too high, disconnection may occur when the second electrode 15 is formed.

Light emitting layers 14R, 14G and 14B in the above embodiments can be formed by a relief printing method (a flexo printing method), an intaglio offset printing method, a reverse offset type relief printing method, an ink jet printing method and an intaglio printing method (a gravure offset printing method). If these methods are used, respective light emitting layers 14R, 14G and 14B can be formed on the entire surface of an organic EL element by using respective identical light emitting materials. Therefore, processes for forming light emitting layers 14R, 14G and 14B can be simplified and productivity can be improved. In addition, before light emitting layers 14R, 14G and 14B are formed, the substrate 10 can be subjected to surface processing such as UV processing and plasma processing. Wettability of partition walls 11a, 11b, 11c and 11d and a surface inside a pixel can be uniform, therefore a film thickness of light emitting layers 14R, 14G and 14B can be uniform.

In addition, the above described embodiments are an active matrix type organic EL display. However, the present invention is not limited to these. The present invention can be applied to a passive matrix type organic EL display. In addition, the above described embodiments have light emitting layers comprised of red color, green color and blue color. However, the present invention is not limited to these. For example, light emitting layers can be comprised of four colors of red color, green color, blue color and yellow color. In this case, the order of printing a light emitting layer on a substrate 10 is blue color, green color, yellow color and red color.

An organic light emitting material on the substrate 10 is easily degraded by water or oxygen in atmospheric air. Therefore, the substrate 10 is sealed by a sealing substrate 19 through the sealing resin 16. The sealing resin 16 is preferably formed on a sealing substrate 17. However, the sealing resin 16 can be directly formed on the substrate 10 side.

It is necessary for the permeability of moisture and oxygen in the sealing substrate 17 to be low. In addition, ceramics such as alumina, silicon nitride and boron nitride, glass such as no-alkali glass and alkali glass, quartz, and humidity resistance film are exemplified as an example of the sealing substrate material. However, a material is not limited to these.

For example, the following humidity resistance film is exemplified: a film in which SiOx is formed by a CVD method on both sides thereof a film in which a film having a low permeability of moisture and oxygen and a hydrophilic film are laminated; and a film in which water a absorption agent was applied thereon, the film having a low permeability of moisture and oxygen. It is preferable for a water vapor permeation rate of the humidity resistance film to be equal to or less than $10^{-6}$ g/m$^2$/day.

For example, the following materials can be used for the sealing resin 16: A photo-curing adhesive property resin, a heat curing adhesive property resin and two fluid hardening adhesive property resins including an epoxy type resin, acrylic resin, silicone oil or the like, acrylic resin such as ethylene ethylacrylate (EEA) polymer, vinyl resins such as ethylene vinyl acetate (EVA), thermoplastic resin such as polyamide, synthetic rubber, and thermoplasticity adhesive property resins such as acid denatured substances of polyethylen or polypropylene.

An example of a method for forming the sealing resin 16 on the sealing substrate 17 is shown below: solvent solution method, pushing out laminate method, fusion/hot melt method, calender method, discharge jet application method, screen printing, vacuum laminate method and heated roll laminate method. A material having hygroscopicity and a property to absorb oxygen can be incorporated into the sealing resin 16 if necessary. The thickness of the sealing resin 16 formed on the sealing substrate 17 is decided by the size and configuration of a sealed organic EL display. About 5-500 μm is desirable for the thickness of the sealing resin 16.

Finally, the substrate 10 is arranged on the sealing substrate 17. When thermoplastic resin is used for the sealing resin 16, contact bonding is preferably performed only by a heating roller. In the case of a heat curing type adhesion resin, it is desirable that a heat curing type adhesion resin be heated and hardened at a curing temperature after the resin is attached by pressure using a heating roller. In the case where a photo-curing-related adhesion resin is used, sealing is performed by pressure using a roller. Thereafter, a photo-curing-related adhesion resin can be cured by irradiating light.

A process where the substrate 10 is arranged on the sealing substrate 17 through the sealing resin 16 is performed under a vacuum condition or in an inactive gas atmosphere so that oxygen or water which degrades an organic EL display is not included in the sealing resin 16. In the case where an inactive gas is used, a rare gas such as argon can be used. However, nitrogen is preferably used in view of easy handling or cost.

An organic electroluminescence display and a method for manufacturing the display have the following effects. Chromaticity deviation due to ink mixture is minimized as small as possible. A light emitting layer of a uniform film thickness is formed. Therefore, a uniform and stable light can be emitted. Further, yield in production can be improved.

In an embodiment of the present invention, a second light emitting layer emitting a light of a second wavelength longer than a first wavelength overlaps a first light emitting layer emitting a light of a first wavelength. Therefore, even if a colorant included in a first light emitting layer flows in a second light emitting layer, a colorant of a second light emitting layer which has a lower energy lower than that of a colorant of a first electrode preferentially emits light. Thereby, a color mixture can be prevented. In addition, in the first aspect of the present invention, it is expected that an underlayer (a buffer layer) formed between a hole transport layer and a light emitting layer has an effect that a hole transport property is improved and an effect that an electron moved from a second electrode side is blocked. Therefore, efficiency or life-time of an organic electroluminescence can be improved.

In an embodiment of the present invention, an underlayer (a buffer layer) is formed between a hole transport layer and a light emitting layer. Therefore, it is expected that an effect that a hole transport property is improved and an effect that an electron moved from an second electrode side is blocked are obtained. Therefore, efficiency or life-time of an organic electroluminescence can be improved. In addition, in the second aspect of the present invention, after a first light emitting layer emitting light of a first wavelength is formed, a second light emitting layer emitting light of a second wavelength longer than a first wavelength is formed so that a second light emitting layer overlaps a first light emitting layer. Therefore, even if a colorant included in a first light emitting layer flows in a second light emitting layer, a colorant of a second light emitting layer which has a lower energy than that of a colorant of a first electrode preferentially emits light. Thereby, a color mixture can be prevented.

In an embodiment of the present invention, a pattern of a first electrode is formed, and its first light emitting layer is solidified and dried. Thereafter, a pattern of a second light emitting layer is formed. Therefore, an amount of a first colorant flowing in a second light emitting layer can be reduced. Thereby, color mixture is not easily generated.

In an embodiment of the present invention, respective light emitting layers can be applied to the entire surface of an organic EL element using identical light emitting materials. Therefore, a process for forming a light emitting layer can be simplified, thereby productivity can be improved.

In an embodiment of the present invention, a width of an ink pattern is wider than a distance between partition walls. Therefore, an ink can be surely applied on a pixel region between partition walls, and a light emitting layer superior in flatness of a film thickness can be formed.

In an embodiment of the present invention, a light emitting layer can be formed having superior pattern formation accuracy and uniformity of a film thickness.

In an embodiment of the present invention, a hole transport layer is formed on the entire surface of a first electrode and a partition wall. Further, an underlayer is formed thereon. Therefore, wettability of a surface inside a partition wall can be uniform, and a film thickness of an organic light emitting layer formed thereof can be uniform.

In an embodiment of the present invention, an underlayer can be formed only at a necessary pixel part by a relief printing method. In addition, a film thickness or a wet property of an underlayer can be uniform. Therefore, a film thickness of a light emitting layer formed on an underlayer can be uniform, and uneven light emitting can be reduced.

In an embodiment of the present invention, an underlayer having good wettability is used, thereby an organic light emitting layer having a uniform film thickness can be formed.

EXAMPLES

Hereinafter, the present invention is further explained by Examples and Comparative Examples. However, the present invention is not limited to these.

Example 1

Preparation of a Coating Ink for Forming an Organic Light Emitting Medium Layer

A polymer fluorescent substance (or, a polymer fluorescent substance and a polymer resin as a binder) was dissolved in a solvent so that a concentration of a coating liquid ink was 2.0 wt %. Thereby, a coating ink for forming an organic light emitting medium layer was prepared. Here, three colors of R, G and B comprised of polyfluorene derivative were used in a polymer fluorescent substance as light emitting materials. A composition of an ink solvent included 88 wt % of xylene (boiling point: 139 degrees Celsius) and 10 wt % of tetralin (boiling point: 202 degrees Celsius).

(Manufacturing a Substrate to be Printed)

A base material for forming a transparent electrode (a product of GEOMATEC Corporation) was prepared. The base material was as follows: on a square glass substrate having a thickness of 0.4 mm (length of a side of the glass substrate was 150 mm), an ITO film with a circuit pattern having surface resistivity of 15Ω was formed.

A partition wall was as follows: a positive resist (ZWD6216-6, a product of ZEON CORPORATION) was formed on a surface of an ITO pattern formed side of the substrate by a spin coater so as to have a thickness of 2 μm. Thereafter, a taper shaped partition wall is formed by a photolithography method, thereby the ITO film pattern was sectioned. In addition, in the partition wall, the width in a direction of pattern formation described later was 15 μm, and a distance W1 between the partition walls was 32 μm.

Next, a pattern of molybdenum oxide film of 50 nm thickness was formed by a vacuum vaporization method using a shadow mask as a hole transport layer. The film formation was performed so that the pattern region is the entire surface of a display region. Here, the film formation was performed using a metal mask with an opening of 120 mm×100 mm.

Next, as an underlayer, poly(2,7-(9,9-di-octyl fluorene))-alt-(1,4-phenylene-((4-sec-butylphenyl)imino)-1,4-phenylene) (TFB) was formed by a relief printing method. Stripe underlayers perpendicular to a long side direction of the partition wall and the RGB pixels were formed by printing. As a result, the underlayers were formed at the entire surface of the pixel parts and partition walls sectioning the pixel parts on the substrate. Thereby, a substrate to be printed was manufactured.

(Evaluation of Wettability of a Surface of a Substrate to be Printed)

If an underlayer is formed only at pixel parts, a hole transport layer of molybdenum oxide becomes the upper part of the partition wall on the substrate. Therefore, a difference between wettabilities of surfaces of an underlayer and molybdenum oxide was evaluated.

Firstly, a square glass substrate having a thickness of 0.7 mm and a side of 40 mm was used as a substrate. An underlayer film formation ink was applied thereon by a spin coat method. A contact angle of water (or a solvent for forming a light emitting layer) and an interlayer film was measured using the substrate. In addition, the substrate before the underlayer film formation ink was applied was irradiated with ultra violet rays for 3 min. using a UV/O$_3$ cleaning apparatus (a product of ORC MANUFACTURING CO., LTD.) as a pre-process. After application, the substrate was quickly moved onto a hot plate of 200 degrees Celsius, and baking was performed for 15 min. In this case, a film thickness of the underlayer after drying was about 20 nm.

In the case where a molybdenum oxide film was formed, the same glass substrate was used. A film of molybdenum oxide of 40 nm thickness was formed by a sputtering method. In the case of a molybdenum oxide film, a contact angle was measured by the same method.

Table 1 shows the results of contact angles between an under layer and molybdenum oxide film.

TABLE 1

|  | Water (degree) | Solvent for forming a light emitting layer (degrees) |
|---|---|---|
| An underlayer | 98.4 | 5.3 |
| Molybdenum oxide | 32.8 | 17.4 |

These results show the following: an underlayer has very strong water-repellent properties compared with a molybdenum oxide film. An underlayer has very good wettability for a solvent for forming a light emitting layer. In addition, if a pixel with an underlayer is compared with a partition wall with a hole transport layer wherein the hole transport layer does not have an underlayer thereon, wetterabilities for a solvent for forming a light emitting layer are respectively different. This suggests that a printing stability of an organic light emitting layer is poor in the case where an underlayer is not formed on a partition wall.

In view of the above, the effects of the present invention are as follows: in the case where an underlayer is formed on the entire region of a pattern part of a partition wall substrate, wettability of a partition wall is equal to wettability inside a pixel. Thereby, a film thickness of an organic light emitting layer becomes uniform and uneven light emitting is reduced.

(Manufacturing a Relief Printing Plate)

A base material 1a was a polyethylene terephthalate (PET) base material of 0.3 mm thickness. On the base material 1a, a forming layer of a convex part 1b was formed. The forming layer of the convex part 1b was as follows: a photosensitive water-soluble polymer (a water-soluble resin) was heated and melted at 150 degrees Celsius. This was applied by a spin coat method so as to have a thickness of 0.1 μm.

(Pattern Forming of a Relief Printing Plate)

Stripe patterns comprised of convex parts and concave parts were formed by a photolithograph method wherein the stripe patterns had L/5=30/111 (180 ppi). Using these patterns, a color panel of three colors (R, G and B) can be manufactured by printing red color, and green color and blue color in which printing positions are shifted for respective colors.

(Printing of a Coating Ink for Forming an Organic Light Emitting Medium Layer by a Relief Printing Plate S)

Firstly, a relief printing plate S shown in FIG. 1 was equipped and fixed on a surface of a plate cylinder 6 of a cylinder type relief printing machine (See FIG. 2), and a body to be printed 7 (a substrate to be printed) is placed and fixed to a platen 8 for fixing a body to be printed.

Then, an anilox roll 5 of 500 lines/inch and a plate cylinder 6 were rotated. A coating ink 4a for forming an organic light emitting medium layer was uniformly supplied to a surface of the anilox roll 5 (an ink supplying roller). The ink 4a is supplied to a top surface of a convex part of a relief printing plate through an anilox roll. Thereafter, printing of a pattern-shaped coating ink 4a on the top surface was performed in which printing corresponded to an ITO pattern of the body to be printed 7 (the substrate to be printed). In addition, first time printing consisted of forming a pattern of a coating ink including a blue light emitting colorant.

Next, using the same method, printing of a coating ink including a green light emitting colorant and printing of a coating ink including a red light emitting colorant were performed in this order. In addition, band gaps of respective light emitting colorants are as follows: a red light emitting colorant is 2.01 eV, a green light emitting colorant is 2.38 eV, and a blue light emitting colorant is 2.72 eV. In this way, a colorant having a large band gap has a short light emitting wavelength.

After printing was performed, on the substrate to be printed 7, a coating ink 4a was dried for 5 hours at 150 degrees Celsius. Barium of 7 nm and aluminum of 150 nm were formed on an organic light emitting medium layer which was formed using a coating ink 4a.

Example 2

Instead of molybdenum oxide, a stripe-shaped film of poly (3,4) ethylenedioxy thiophene/polystyrene sulfonate (PE-DOT/PSS) of 100 nm thickness was formed as a hole transport layer by a spin coater so that the stripe was perpendicular to a direction of a long side of a partition wall and RGB pixels. This thin film of PEDOT/PSS was dried for 1 hr. in a reduced pressure at 180 degrees Celsius. An organic EL display was manufactured by the same method as Example 1 except for the above.

Comparative Example 1

An organic EL display was manufactured by the same method as Example 1 except that forming a pattern by printing a coating liquid including a red light emitting colorant, forming a pattern by printing a coating liquid including a green light emitting colorant and forming a pattern by printing a coating liquid including a blue light emitting colorant were performed in this order.

Example 3

A width of a partition wall in a direction of printing of an organic light emitting medium layer was about 22 μm, and distance W1 between partition walls was 25 μm. In the case where a pattern of an organic light emitting medium layer was formed using a coating ink, position adjustment was performed, and a pattern-shaped coating ink on a top surface of a convex part was printed so that the convex part covers an opening of a pixel. An organic EL display was manufactured by the same process as Example 1 except for the above.

Example 4

A width of a partition wall in a direction of printing of an organic light emitting medium layer was about 22 μm, and distance W1 between partition walls was 25 μm, the same as Example 3. In addition, a relief printing plate for forming an organic light emitting medium layer was formed so as to have convex parts and concave parts of stripe patterns in which L/S=20/121 μm. An organic EL display was manufactured by the same process as Example 1 except for the above.

<Comparison Results>

Figure 12:
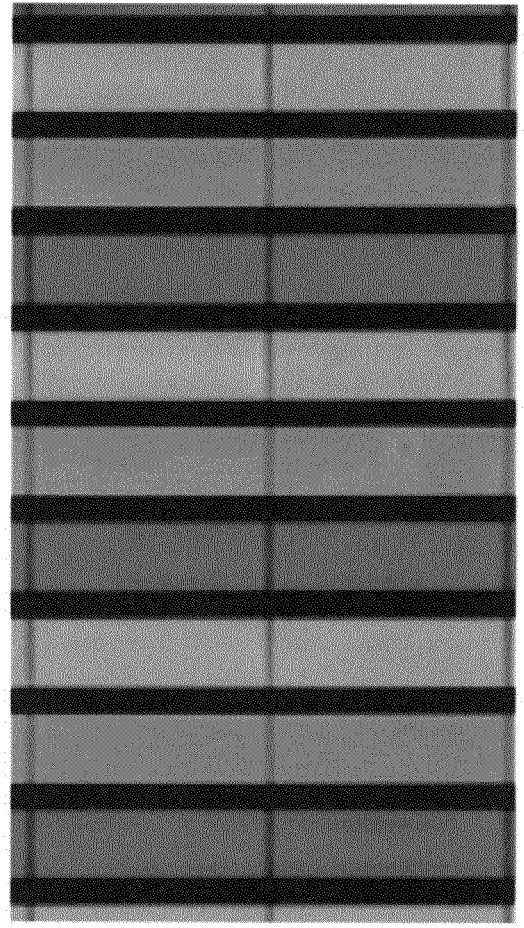
FIG. 12 is a photograph of emitted light from an organic EL display manufactured in Example 1 and 2 of the present invention.
Figure 13:
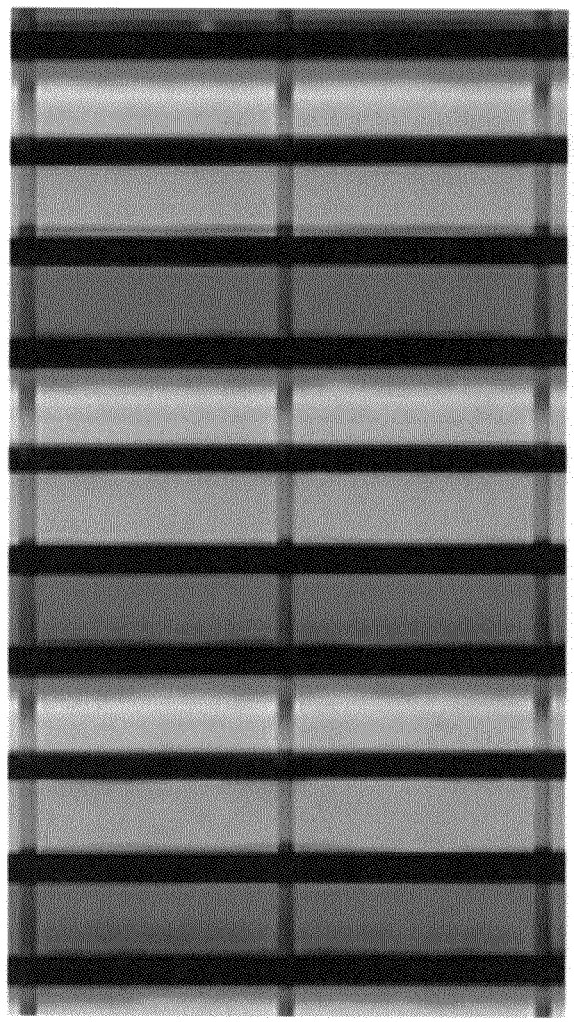
FIG. 13 is a photograph of emitted light from an organic EL display manufactured in Comparative Example 1.

FIG. 12 is a photograph of emitted light of an organic EL display manufactured in Examples 1 and 2 of the present invention. That is, FIG. 12 shows a case where a light emitting layer 14R, a light emitting layer 14G and a light emitting layer 14B were formed in this order. FIG. 13 is a photograph of emitted light of an organic EL display manufactured in Comparative Example 1. That is, FIG. 13 shows a case where a light emitting layer 14R, a light emitting layer 14G and a light emitting layer 14B were formed in this order.

A voltage was applied to an organic EL display manufactured in Examples 1 and 2 through an ITO film. When the state of emitted light was confirmed, an organic light emitting medium layer had an even film thickness, and uneven emitted light was not observed as shown in FIG. 12. However, a voltage was applied to an organic EL display manufactured in Comparative Example 1 through an ITO film, and when the state of emitted light was confirmed, colors of emitted light were different in some spots, that is, uneven as a whole and color mixtures occurred.

FIGS. 14 and 15 show a cause of color mixtures in an organic EL display manufactured in Comparative Example 1. A cause of color mixtures in an organic EL display manufactured in Comparative Example 1 is as follows: as shown in FIG. 14, a newly coated ink (here, a light emitting layer 14B) dissolves a pre-coated solidified ink (here, a light emitting layers 14R and 15G) and pulls the pre-coated solidified ink inside a pixel. A portion 50 (See FIG. 15) in which a light emitting colorant of an adjacent pixel is mixed, had color changes and this change causes uneven emitted light.

In Examples 3 and 4, a color mixture of emitted light was not observed. In Example 3, overlapping occurred on all partition walls sandwiched by pixels. Light emitted layers covered the entire element. On the other hand, in Example 4, overlapping portions and non-overlapping portions on a partition wall were produced and in Example 3, a film thickness roughness was small and light emitting was even compared with Example 4.

[Industry Applicability]

In an organic electroluminescence display and a method for manufacturing the display of the present invention, chromaticity deviation due to color mixture of inks is minimized as much as possible, and yield can be improved. Therefore, the present invention is useful for manufacturing a high definition display.

What is claimed is:

1. An organic electroluminescence display, comprising:
   a substrate with a partition wall and a thin film transistor between adjacent organic electroluminescence elements;
   a first electrode layer formed on the substrate, the first electrode layer being in contact with the thin film transistor;
   a hole transport layer formed on both the first electrode layer and the partition wall;
   an underlayer having a stripe shape formed on the hole transport layer;
   a first light emitting layer formed on the underlayer, the first light emitting layer configured to emit light having a first wavelength;
   a second light emitting layer formed so as to partially overlap the first light emitting layer, the second light emitting layer configured to emit light having a second wavelength, and the second wavelength being longer than the first wavelength; and
   a second electrode layer,
   wherein
   an overlapping point of the first light emitting layer and the second light emitting layer is above the underlayer formed above the partition wall,
   and
   wherein the first light emitting layer has a stripe shape, the second light emitting layer has a stripe shape, and the first light emitting layer and the second light emitting layer are perpendicular to the underlayer.

2. The organic electroluminescence display according to claim 1,
   wherein the hole transport layer is formed on an entire upper surface of both the first electrode layer and the partition wall.

3. A method for manufacturing an organic electroluminescence display, the method comprising:
- a first step in which a first electrode layer is formed on a substrate having a partition wall and a thin film transistor between adjacent organic electroluminescence elements, the first electrode layer being in contact with the thin film transistor;
- a second step in which a hole transport layer is formed on both the first electrode layer and the partition wall;
- a third step in which an underlayer having a stripe shape is formed on the hole transport layer on both the first electrode layer and the partition wall;
- a fourth step in which a first light emitting layer is formed on the underlayer, the first light emitting layer configured to emit light having a first wavelength;
- a fifth step in which a second light emitting layer is formed on the underlayer so as to partially overlap the first light emitting layer, the second light emitting layer configured to emit light having a second wavelength, and the second wavelength being longer than the first wavelength; and
- a sixth step in which a second electrode layer is formed on the first or second light emitting layer,
- wherein, in the fourth step and the fifth step, the first light emitting layer is formed so as to have a stripe shape, the second light emitting layer is formed so as to have a stripe shape, and the first light emitting layer and the second light emitting layer are perpendicular to the underlayer.

4. The method for manufacturing an organic electroluminescence display according to claim 3, wherein, in the fourth step, the first light emitting layer is formed by forming a pattern using an ink including a first colorant emitting light of the first wavelength, and wherein in the fifth step, after the first light emitting layer is solidified, the second light emitting layer is formed by forming a pattern using an ink including a second colorant emitting light of the second wavelength.

5. The method for manufacturing an organic electroluminescence display according to claim 4, wherein, in the fourth step and fifth steps, the first and second light emitting layers are formed by transferring the ink including the first colorant and the ink including the second colorant, respectively, from a transfer body to the substrate.

6. The method for manufacturing an organic electroluminescence display according to claim 5, wherein a width of a pattern of the ink transferred from the transfer body to the substrate is longer than a distance between adjacent partition walls.

7. The method for manufacturing an organic electroluminescence display according to claim 3, wherein, in the fifth step, the second light emitting layer is formed so as to overlap the first light emitting layer wherein an overlapping point of the first light emitting layer and the second light emitting layer is above the underlayer formed on the partition wall.

8. The method for manufacturing an organic electroluminescence display according to claim 3, wherein the first light emitting layer and the second light emitting layer are formed by a relief printing method.

9. The method for manufacturing an organic electroluminescence display according to claim 3, wherein, in the third step, the underlayer is formed by a relief printing method.

* * * * *